(12) United States Patent
Ishizawa et al.

(10) Patent No.: US 7,526,854 B2
(45) Date of Patent: May 5, 2009

(54) MANUFACTURING METHOD OF ELECTRONIC DEVICE

(75) Inventors: Haruhiko Ishizawa, Tokyo (JP); Ryuji Jin, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 42 days.

(21) Appl. No.: 11/517,462

(22) Filed: Sep. 8, 2006

(65) Prior Publication Data
US 2007/0053310 A1 Mar. 8, 2007

(30) Foreign Application Priority Data
Sep. 8, 2005 (JP) ............................. 2005-260461

(51) Int. Cl.
H01Q 17/00 (2006.01)
(52) U.S. Cl. ............................. 29/601; 29/600; 29/832; 29/592.1; 343/700 MS
(58) Field of Classification Search ........... 29/830–834, 29/592.1, 600, 564.1–564.4; 343/700 MS, 343/895; 340/572.5, 572.7; 174/254, 262; 361/395, 681, 737
See application file for complete search history.

(56) References Cited

U.S. PATENT DOCUMENTS

| | | | | |
|---|---|---|---|---|
| 5,055,968 A | * | 10/1991 | Nishi et al. ................. | 361/737 |
| 6,281,842 B1 | * | 8/2001 | Moren ................. | 343/700 MS |
| 6,395,043 B1 | * | 5/2002 | Shadle et al. ............... | 29/623.4 |
| 7,051,429 B2 | * | 5/2006 | Kerr et al. ...................... | 29/825 |
| 7,254,883 B2 | * | 8/2007 | Schmid et al. ................ | 29/600 |
| 7,260,882 B2 | * | 8/2007 | Credelle et al. ............... | 29/600 |
| 7,278,203 B2 | * | 10/2007 | Aoyama et al. ................ | 29/740 |
| 2003/0205399 A1 | * | 11/2003 | Uchihiro et al. ............ | 174/52.4 |

FOREIGN PATENT DOCUMENTS

JP 2005-149352 6/2005

* cited by examiner

*Primary Examiner*—Minh Trinh
(74) *Attorney, Agent, or Firm*—Antonelli, Terry, Stout & Kraus, LLP.

(57) ABSTRACT

The conveying precision of a continuation inlet tape in the production line of the inlet for electronic tags is improved. A first structural body used as an inlet is moved to an inspection position where a communication characteristic test is carried out, and a CCD camera photographs the plane image of the structural body in the inspection position, and transmits image data to an image sensor controller. The image sensor controller measures the amount of location drifts of the structural body, analyzing the image data transmitted from the CCD camera, and transmits to a programmable controller as a correction value. It is transmitted to a positioning unit as actual movement magnitude, adjusting the correction value to the movement magnitude of standard, and the following structural body is moved according to the transmitted movement magnitude.

8 Claims, 34 Drawing Sheets

MANUFACTURING METHOD OF ELECTRONIC DEVICE

CROSS-REFERENCE TO RELATED APPLICATION

The present application claims priority from Japanese patent application No. 2005-260461 filed on Sep. 8, 2005, the content of which is hereby incorporated by reference into this application.

1. Field of the Invention

The present invention relates to the manufacturing technology of an electronic device, and particularly relates to an effective technology in the application to the manufacturing process of the inlet for noncontact type electronic tags.

2. Description of the Background Art

In Japanese Unexamined Patent Publication No. 2005-149352 (Patent Reference 1), the means which correctly cut detecting the location of an IC module with sufficient accuracy by a detection means's detecting the location of a protection plate, and positioning a sheet-shaped IC module controlling actuation of a web carrying means by a control means prior to the cutting of the sheet-shaped IC module which has arranged the protection plate which protects an IC chip to a winding wire coil in the specified position, and also prevent different form mixing surely is disclosed.

[Patent Reference 1] Japanese Unexamined Patent Publication No. 2005-149352

SUMMARY OF THE INVENTION

A noncontact type electronic tag is a tag which makes the memory circuit in a semiconductor chip memorize desired data, and reads this data using the microwave, and has the structure which mounted the semiconductor chip in the antenna formed from a lead frame.

Since an electronic tag makes the memory circuit in a semiconductor chip memorize data, it has the advantage that mass data are memorizable compared with the tag using a bar code etc. There is also an advantage that an unjust alteration is difficult for the data which the memory circuit was made to memorize compared with the data which the bar code was made to memorize.

In the production line of the inlet for electronic tags, the continuation inlet tape is used as a material and the transportation in each manufacturing apparatus constitutes a tape carrier system. Tape carrier systems include a sprocket carrier system and a roller carrier system.

The sprocket carrier system is a method which uses a gear which has the projection hooked on a hole and which is called a sprocket, hooks the hole (sprocket hole) formed in the ends of the continuation inlet tape along the transportation direction on the projection, and transports the continuation inlet tape by the revolution of the sprocket. Since this method hooks the projection on the hole having an opening at equal intervals and transports the continuation inlet tape by the revolution of the sprocket, there are few accumulated errors of transportation distance. When the stepping motor which operates by a fixed step angle is used as a driving source of the sprocket, the continuation inlet tape can be transported one by one at equal intervals. However, the problems that it is easy to damage the hole since the projection of the sprocket is caught in the hole of the continuation inlet tape, and variation will occur in accuracy of position according to deformation of the hole since the hole itself may be deforming by damage from the beginning exist. The projection of the sprocket may separate from the hole in the middle of transportation, and the problem that the continuation inlet tape will derail exists.

On the other hand, the roller carrier system is a method which sandwiches the continuation inlet tape with two rollers, and transports it by frictional force. A thin continuation inlet tape can also be dealt with, and this method has few damages to the continuation inlet tape, and can do high-speed transportation of the continuation inlet tape. However, when the continuation inlet tape is slippery with the variation in frictional force, or transportation causes of error, such as a geometrical error of the circle which forms a roller, the rigidity of a machine body including a facility or an environment, and forming accuracy of a guide, exist, the problem that the conveying precision of the continuation inlet tape is not stabilized exists.

One purpose of one typical invention disclosed by the present application is to offer the technology which can improve the conveying precision of the continuation inlet tape in the production line of the inlet for electronic tags.

Of the inventions disclosed in the present application, typical one will next be summarized briefly.

A manufacturing method of an electronic device according to this invention comprises the following steps, and the electronic device has an antenna which includes a conductive film formed in a main surface of an insulating film, a slit which is formed in a part of the antenna, and whose end extends and exists to an outer edge of the antenna, a semiconductor chip electrically connected to the antenna via a plurality of bump electrodes, and resin which seals the semiconductor chip:

(a) preparing the insulating film of continuation tape form with which a plurality of structural bodies which electrically connect the semiconductor chip with each of a plurality of the antenna over the main surface were formed;

(b) moving a first structural body of the structural bodies to a first location, transporting by frictional force pinching both sides of the insulating film of continuation tape form with two rollers;

(c) performing a first process to the first structural body under a situation where the first structural body moved to the first location;

(d) measuring a first amount of drifts between the first structural body and the first actual location from a first image, acquiring the first image of the first structural body under the situation where the first structural body moved to the first location; and (e) moving a second structural body continuously arranged in a first pitch with the first structural body among the structural bodies toward the first location only a first distance that applied the first amount of drifts to the first pitch, transporting by frictional force pinching both sides of the insulating film of continuation tape form with the two rollers.

It will be as follows, when dividing into an item the other outlines disclosed by the present application and explaining briefly.

Item 1: A manufacturing device used for manufacture of an electronic device having an antenna which includes a conductive film formed in a main surface of an insulating film, a slit which is formed in a part of the antenna, and whose end extends and exists to an outer edge of the antenna, a semiconductor chip electrically connected to the antenna via a plurality of bump electrodes, and resin which seals the semiconductor chip, comprising the steps of:

(a) preparing the insulating film of continuation tape form with which a plurality of structural bodies which electrically connect the semiconductor chip with each of a plurality of the antenna over the main surface were formed;

(b) moving a first structural body of the structural bodies to a first location, transporting by frictional force pinching both sides of the insulating film of continuation tape form with two rollers;

(c) performing a first process to the first structural body under a situation where the first structural body moved to the first location;

(d) measuring a first amount of drifts between the first structural body and the first actual location from a first image, acquiring the first image of the first structural body under the situation where the first structural body moved to the first location; and (e) moving a second structural body continuously arranged in a first pitch with the first structural body among the structural bodies toward the first location only a first distance that applied the first amount of drifts to the first pitch, transporting by frictional force pinching both sides of the insulating film of continuation tape form with the two rollers.

Item 2: A manufacturing device according to item 1, wherein
repeating the step (c) and the step (d) dealing the second structural body as the first structural body after the step (d), the step (c) and the step (d) are carried out to all of the structural bodies.

Item 3: A manufacturing device according to item 1, wherein
the first amount of drifts is determined in a direction along a transportation direction of the insulating film.

Item 4: A manufacturing device according to item 1, wherein
the first process is an electric-wave characteristic test of the first structural body; and
when a defect is detected by the electric-wave characteristic test, the semiconductor chip is removed from the first structural body.

Item 5: A manufacturing device according to item 4, wherein
each of the structural bodies is continuously arranged in the first pitch with the structural body which adjoins; and
in a second location which is spaced out by an integral multiple of the first pitch from the first location in a transportation direction of the insulating film, the semiconductor chip is removed from the first structural body from which the defect was detected by the electric-wave characteristic test by a removing means arranged over the second location.

Item 6: A manufacturing device according to item 2, wherein
each of the structural bodies is continuously arranged in the first pitch with the structural body which adjoins;
the first process is an electric-wave characteristic test of the first structural body;
when a defect is detected by the electric-wave characteristic test, the semiconductor chip is removed from the first structural body; and
in a third location which is spaced out by an integral multiple of the first pitch from the first location in a transportation direction of the insulating film, existence of the semiconductor chip in the first structural body is detected by a first optical detecting means, and a first number of the first structural body including the semiconductor chip and a second number of the first structural body that does not include the semiconductor chip are investigated, respectively.

Item 7: A manufacturing device according to item 6, wherein
the first optical detecting means detects existence of the semiconductor chip in the first structural body by picture processing.

Item 8: A manufacturing device according to item 1, wherein
before the first process, a first test is beforehand performed to the structural bodies;
the semiconductor chip is beforehand removed from that from which a defect was detected by the first test before the first process among the structural bodies; and
in the first process, existence of the semiconductor chip in the first structural body is distinguished from the first image, and a first number of the first structural body including the semiconductor chip and a second number of the first structural body that does not include the semiconductor chip are investigated, respectively.

Item 9: A manufacturing device according to item 8, wherein
each of the structural bodies is continuously arranged in the first pitch with the structural body which adjoins; and
in a third location which is spaced out by an integral multiple of the first pitch from the first location in a transportation direction of the insulating film, existence of the semiconductor chip in the first structural body is detected by an optical processing using a laser by a first optical detecting means, and a first number of the first structural body including the semiconductor chip and a second number of the first structural body that does not include the semiconductor chip are investigated, respectively.

Item 10: A manufacturing device according to item 8, wherein
the first test is one or more of an electrical characteristics inspection of the structural bodies, and a visual inspection of the structural bodies.

Item 11: A manufacturing device according to item 10, wherein
the defect in case the first test includes the visual inspection of the structural bodies includes one or more of adhesion of debris to the first structural body, blemish generated in the first structural body, sealing failure of the resin, breakage of the semiconductor chip, deformation of the first structural body, and recognition failure of a distinguishing mark formed in the first structural body.

Item 12: A manufacturing device according to item 1, wherein
before the first process, a first test including one or more of an electric-wave characteristic test and a visual inspection is beforehand performed to the structural bodies;
the semiconductor chip is beforehand removed from that from which defect was detected by the first test before the first process among the structural bodies;
in the first process, existence of the semiconductor chip in the first structural body is distinguished from the first image;
in the first process, when existence of the semiconductor chip in the first structural body is confirmed, the insulating film is cut after moving a first holding means to a fourth location that receives the first structural body, and the first structural body is individually separated and accommodated in the first holding means; and
in the first process, when it is confirmed that the semiconductor chip does not exist in the first structural body, after evacuating the first holding means from the fourth location, the insulating film is cut, and the first structural body is individually separated.

Item 13: A manufacturing device according to item 12, wherein
when it is confirmed in the first process that the semiconductor chip does not exist in the first structural body, the first holding means is evacuated from the fourth location, the insulating film is cut after moving a second holding means to the fourth location, and the first structural body is individually separated and accommodated in the second holding means; and by a cutting means which operates by detecting existence of the first holding means and the second holding means in the fourth location, the insulating film is cut and the first structural body is individually separated.

Item 14: A manufacturing device according to item 12, wherein the defect in case the first test includes the visual inspection of the structural bodies includes one or more of adhesion of debris to the first structural body, blemish generated in the first structural body, sealing failure of the resin, breakage of the semiconductor chip, deformation of the first structural body, and recognition failure of a distinguishing mark formed in the first structural body.

Item 15: A manufacturing device according to item 1, wherein one or more first holes are formed in both ends in a width direction of the insulating film which intersects perpendicularly with a transportation direction in the first process; and the first amount of drifts is determined in a second amount of drifts along a transportation direction and a third amount of drifts in the width direction of the insulating film.

Item 16: A manufacturing device according to item 15, wherein movement of a part corresponding to the third amount of drifts of the first amounts of drifts that form the first distance at the time of movement of the second structural body of the step (e) is carried out by changing a relative location of an opening means and the insulating film, moving the opening means which forms the first hole only the third amount of drifts in the width direction.

Item 17: A manufacturing device according to item 16, wherein each of the structural bodies is continuously arranged in the first pitch with the structural body which adjoins; and in a third location which is spaced out by an integral multiple of the first pitch from the first location in a transportation direction of the insulating film, a second image of the structural body under the third location is acquired, and the third amount of drifts is measured from the second image.

Item 18: A manufacturing device according to item 1, wherein the structural bodies form one or more product groups;

the structural bodies which form the one product group are arranged continuously;

before the first process, a first mark that identifies the product group is given to the structural body of beginning and last of the structural bodies which form the one product group in a second location spaced out from the first location towards the insulating film extending and existing;

furthermore before the first process, the one product group is moved to a fifth location, external appearance of the structural bodies included in the one product group is tested by visual observation of an operator, the structural body from which external appearance failure was detected is moved to the second location, and the semiconductor chip is removed from the structural body under a situation where the structural body moved to the second location; and in the first process, existence of the semiconductor chip in the structural body is distinguished from the first image, and a first number of the structural body including the semiconductor chip and a second number of the structural body which does not include the semiconductor chip are investigated, respectively.

Item 19: A manufacturing device according to item 18, wherein when the structural body from which the external appearance failure was detected is located in a transportation direction side of the insulating film from the second location, the structural body from which the external appearance failure was detected is moved to the second location by moving in a direction contrary to the transportation direction; and a third number of the structural body including the semiconductor chip and a fourth number of the structural body which does not include the semiconductor chip which pass through the first location while the structural body from which the external appearance failure was detected moves to the second location are reduced from the first number and the second number, respectively.

Item 20: A manufacturing device according to item 19, wherein each of the structural bodies is continuously arranged in the first pitch with the structural body which adjoins; and in a third location which is spaced out by an integral multiple of the first pitch from the first location in a transportation direction of the insulating film, by an optical processing using a laser by a first optical detecting means, existence of the semiconductor chip in the structural body is detected, and a fifth number of the structural body including the semiconductor chip and a sixth number of the structural body which does not include the semiconductor chip are investigated, respectively.

Item 21: A manufacturing device according to item 20, wherein a seventh number of the structural body including the semiconductor chip and an eighth number of the structural body which does not include the semiconductor chip which pass through the third location while the structural body from which the external appearance failure was detected moves to the second location are reduced from the fifth number and the sixth number, respectively.

Item 22: A manufacturing device according to item 18, wherein the external appearance failure includes one or more of adhesion of debris to the first structural body, blemish generated in the first structural body, sealing failure of the resin, breakage of the semiconductor chip, deformation of the first structural body, and recognition failure of a distinguishing mark formed in the first structural body.

Advantages achieved by some of the most typical aspects of the invention disclosed in the present application will be briefly described below.

That is, the conveying precision of a continuation inlet tape (insulating film) in the production line of the inlet for electronic tags can be improved.

DETAILED DESCRIPTION OF THE PREFERRED EMBODIMENTS

Figure 1:
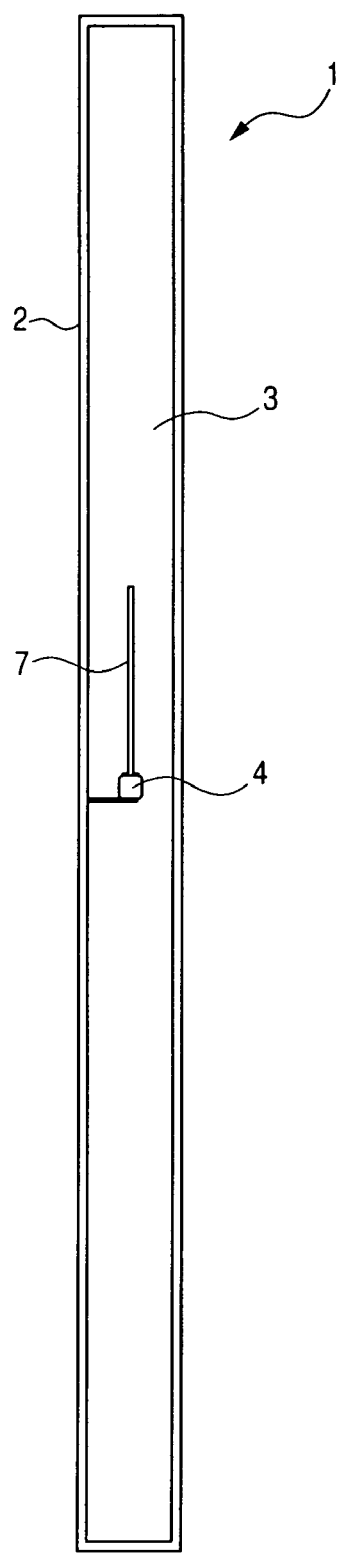
FIG. 1 is a plan view (front surface side) showing the inlet for electronic tags which is an electronic device of Embodiment 1 of the present invention.

Prior to detailed description of the inventions according to this application, the meanings of the terms used herein will next be described.

The term "electronic tag" means central electronic parts of a RFID (Radio Frequency IDentification) system or an EPC (Electronic Product Code) system, what generally put in electronic intelligence, the communication function, and the data rewriting function to the chip of several millimeters or less (the case beyond it is included) is meant, and it communicates with a reading machine by the electric wave or electromagnetic waves. It is also called a radio tag or an IC tag, and complicated information processing is attained at high-level rather than a bar code by attaching to goods. With the non-contact transfer-of-power technology from the antenna side (the outside or the inside of a chip), a tag available semipermanently without a battery also exists. A tag has various configurations, such as a label type, a card shape, a coin type, and a stick type, and is chosen according to an application. As for a communication range, there is an about several millimeters thing to several meters thing, and this is also properly used according to an application.

The term "inlet (Generally it is a complex of a RFID chip and an antenna. However, there are also a thing without an antenna and a thing which accumulated the antenna on the chip. Therefore, a thing without an antenna may also be included in an inlet.)" means the fundamental types of products in the state where the IC chip was mounted in the metal coil (antenna), and although the metal coil and the IC chip will generally be in a bare state, they may be sealed.

The term "control hole" means the hole formed in the first and the last things of a plurality of inlets which form one product group (lot) in a plurality of inlets formed on the insulating film of tape form, and shows initiation and termination of one product group.

The term "pulse motor" means a thing that motion control is possible by the input of a pulse signal, it rotates by a definite angle when a pulse signal is inputted, and the rotating speed is controlled by the frequency of the pulse signal.

In the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated.

Further, in the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number.

Moreover, in the below-described embodiments, it is needless to say that the constituting elements (including element steps) are not always essential unless otherwise specifically indicated or principally apparent that they are essential. Further, it is natural that it is not what eliminates the other element about a constituent element etc. except for the case where it is specified that it is only the element especially when saying, "it consists of A" and etc., in an embodiment etc.

Similarly, in the below-described embodiments, when a reference is made to the shape or positional relationship of the constituting elements, that substantially analogous or similar to it is also embraced unless otherwise specifically indicated or principally apparent that it is not. This also applies to the above-described value and range.

Further, in all the drawings for describing the embodiments, members of a like function will be identified by like reference numerals and overlapping descriptions will be omitted.

Further, in the drawings used in the below-described embodiments, even a plan view is sometimes partially hatched for facilitating understanding of it.

Hereafter, embodiments of the invention are explained in detail based on drawings.

Embodiment 1

Figure 2:
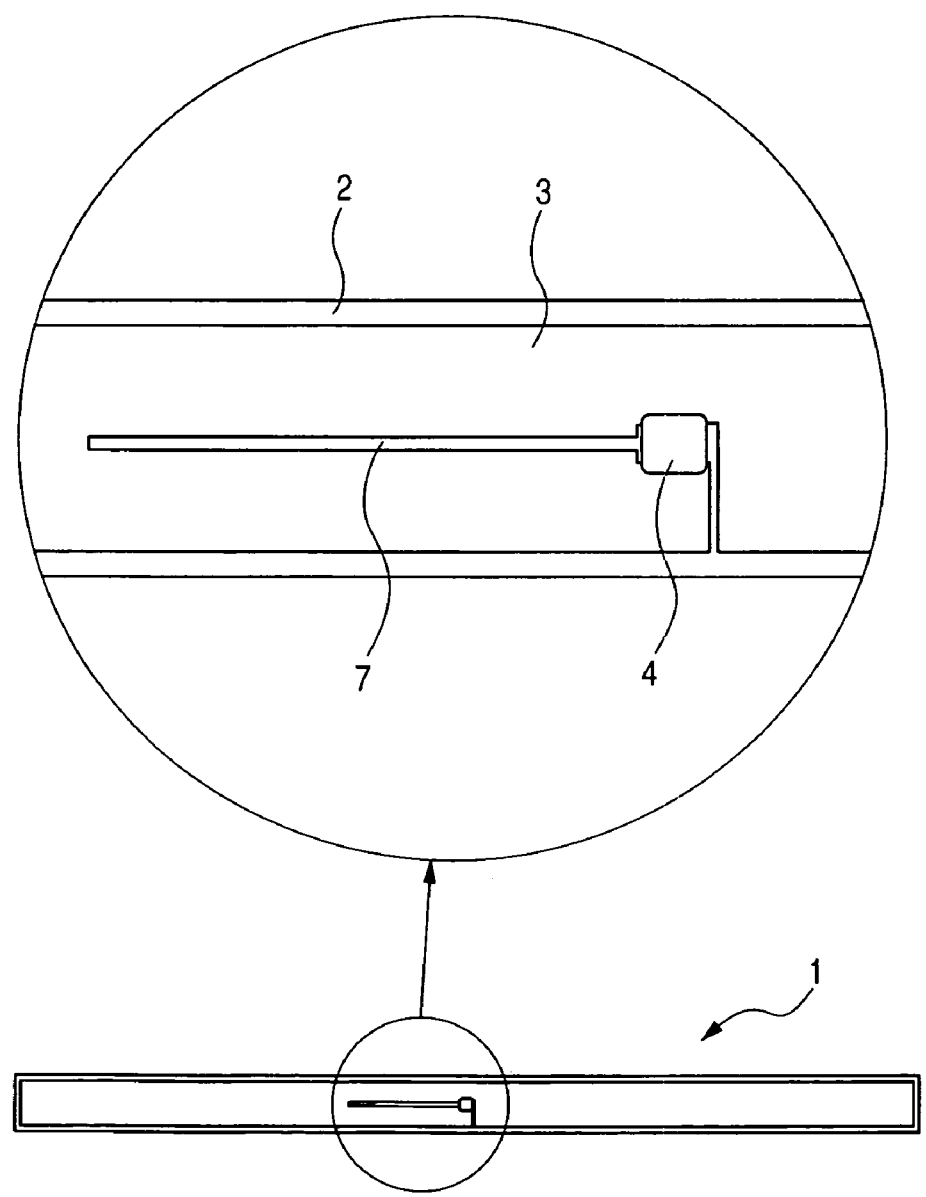
FIG. 2 is a plan view expanding and showing a part of FIG. 1.
Figure 3:
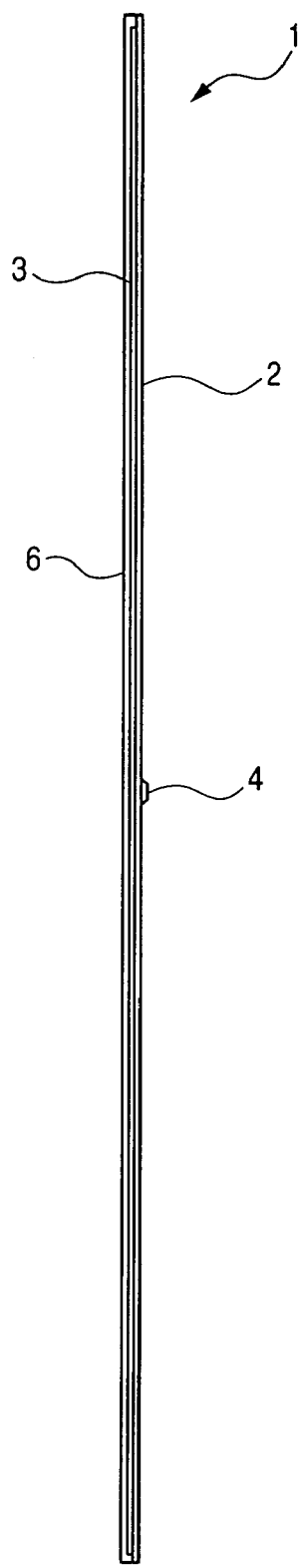
FIG. 3 is a side view showing the inlet for electronic tags which is an electronic device of Embodiment 1 of the present invention.
Figure 4:
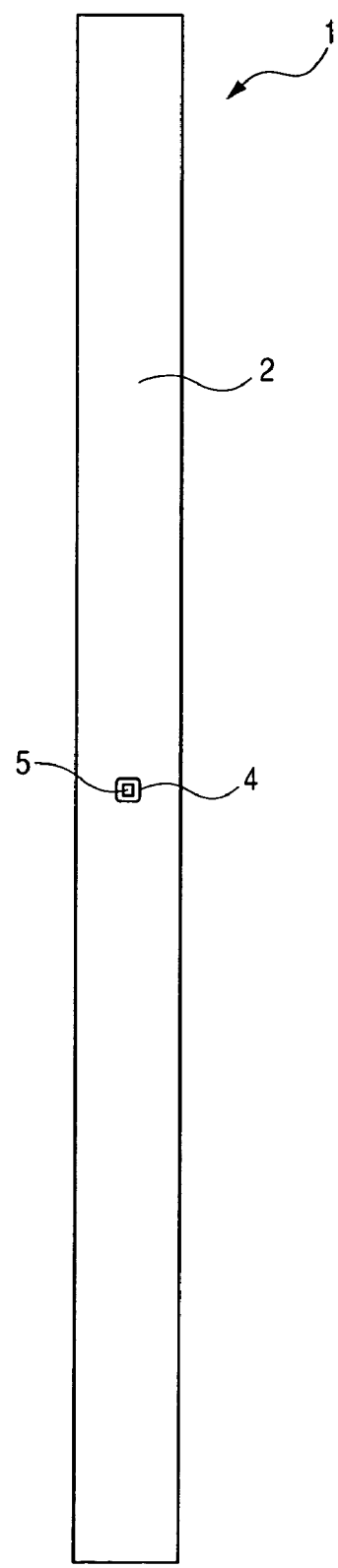
FIG. 4 is a plan view (back surface side) showing the inlet for electronic tags which is an electronic device of Embodiment 1 of the present invention.
Figure 5:
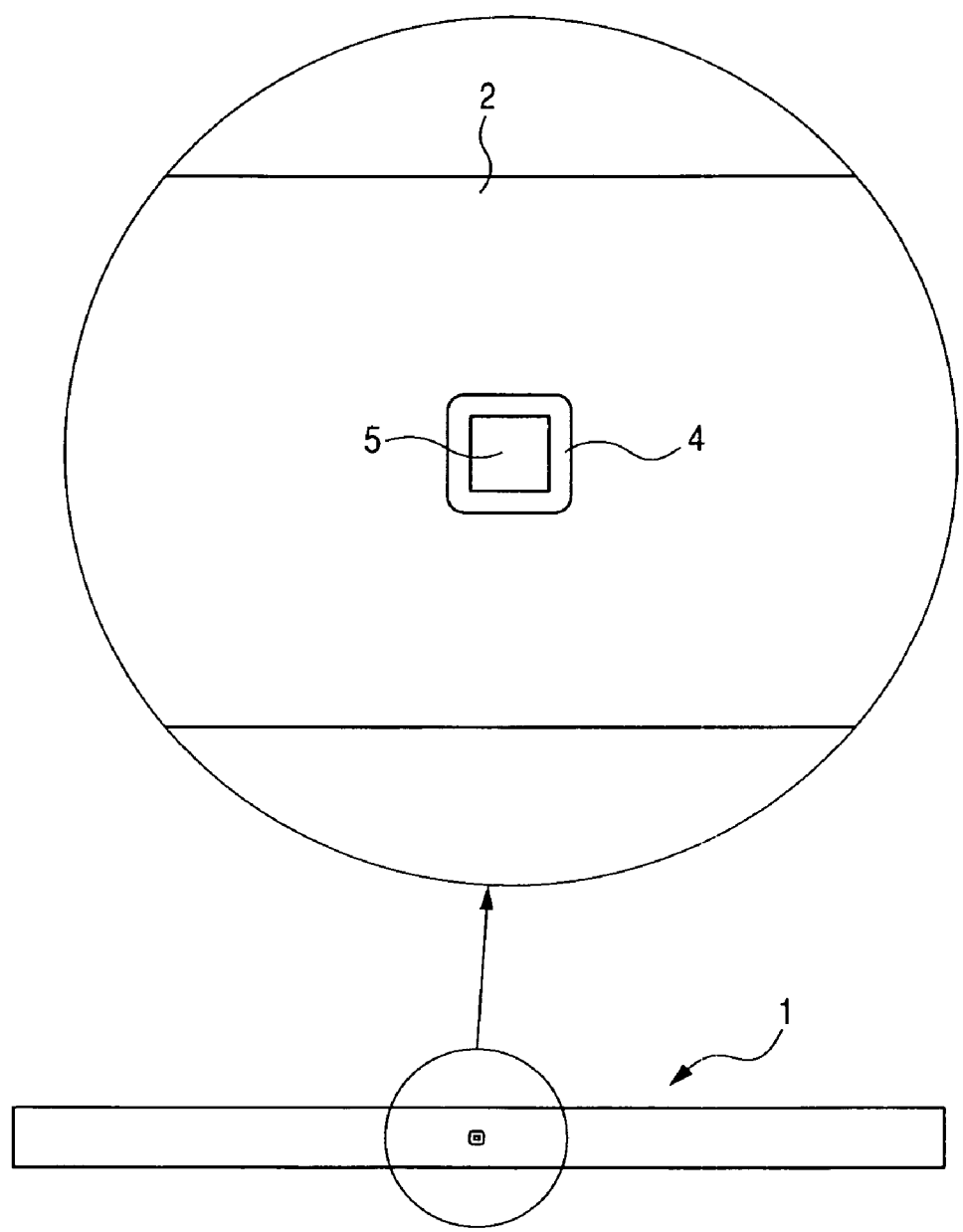
FIG. 5 is a plan view expanding and showing a part of FIG. 4.

FIG. 1 is a plan view (front surface side) showing the inlet for electronic tags which is an electronic device of Embodiment 1, FIG. 2 is a plan view expanding and showing an part of FIG. 1, FIG. 3 is a side view showing the inlet for electronic tags of Embodiment 1, FIG. 4 is a plan view (back surface side) showing the inlet for electronic tags of Embodiment 1, and FIG. 5 is a plan view expanding and showing an part of FIG. 4. As described above, some or all of this embodiment (example) is some or all of a consecutive embodiment (example). Therefore, about the overlapping portion, explanation is omitted in principle.

Inlet 1 for electronic tags of Embodiment 1 (only henceforth an inlet) forms the main part of the noncontact type electronic tag provided with the antenna for microwave reception. This inlet 1 is provided with antenna 3 which includes Al foil (conductive film) adhered on one side of insulating film 2 of a long and slender rectangle, and chip 5 connected to antenna 3 where a front surface and a side face are sealed by potting resin 4. On the one surface (surface in which antenna 3 was formed) of insulating film 2, cover film 6 for protecting antenna 3 and chip 5 is laminated according to need.

The length of antenna 3 along the long side direction of the above-mentioned insulating film 2 is 56 mm, for example, and it is optimized so that a microwave with a frequency of 2.45 GHz can be received efficiently. The width of antenna 3 is 3 mm, and it is optimized so that a miniaturization, and strength reservation of inlet 1 can be compatible.

Slit 7 of the shape of an "L" character whose end arrives at the outer edge of antenna 3 is formed in the almost central part of antenna 3, and chip 5 sealed by potting resin 4 is mounted in the halfway part of this slit 7.

Figure 6:
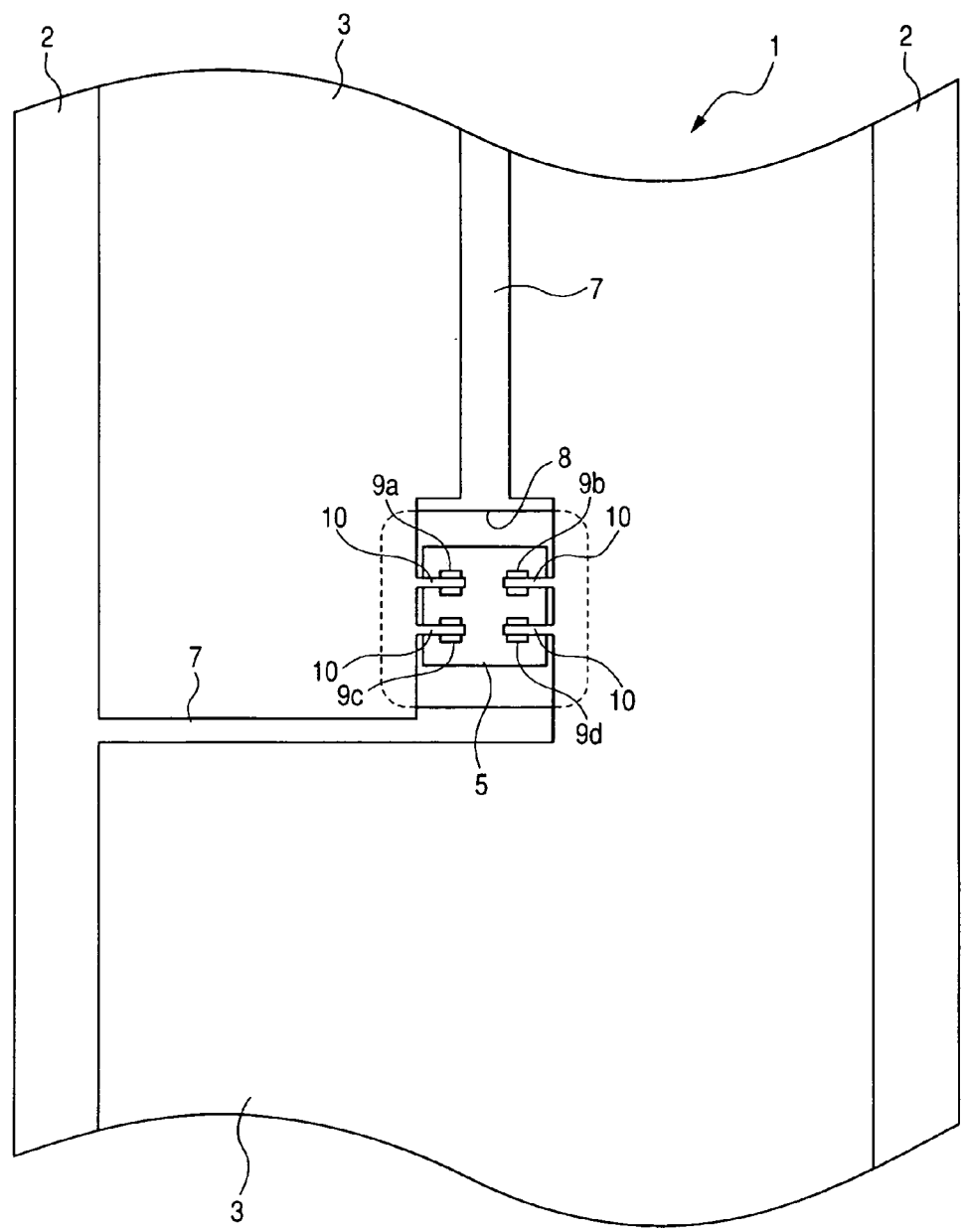
FIG. 6 is a principal part enlarged plan view (front surface side) of the inlet for electronic tags which is an electronic device of Embodiment 1 of the present invention.
Figure 7:
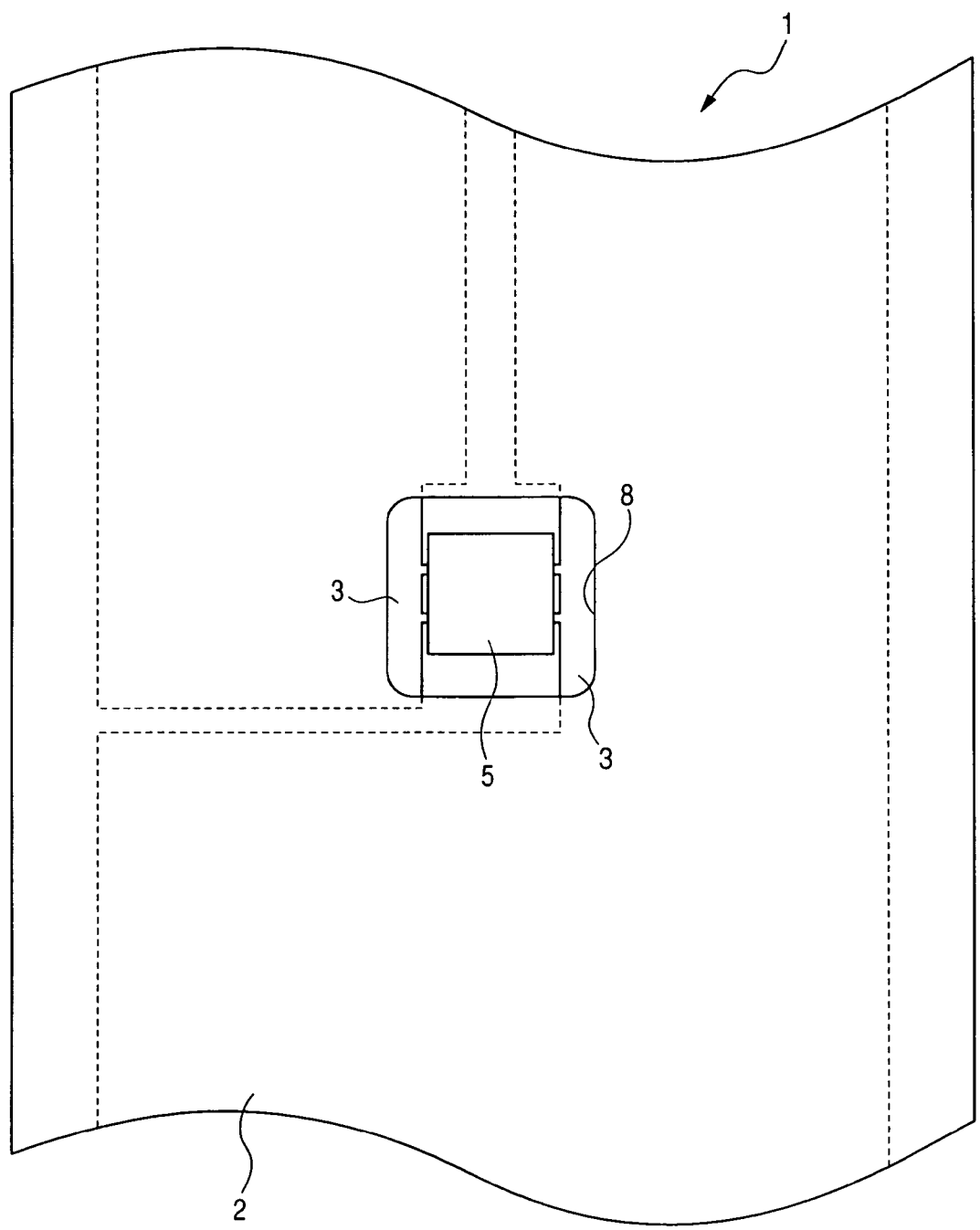
FIG. 7 is a principal part enlarged plan view (back surface side) of the inlet for electronic tags which is an electronic device of Embodiment 1 of the present invention.

FIG. 6 and FIG. 7 are the plan views expanding and showing near the central part of antenna 3 with which the above-mentioned slit 7 was formed, FIG. 6 shows the front surface side of inlet 1, and FIG. 7 shows the back surface side, respectively. In these drawings, illustration of potting resin 4 which seals chip 5, and cover film 6 is omitted.

Like illustration, device hole 8 which is formed punching a part of insulating films 2 is formed in the halfway part of slit 7, and the chip 5 is arranged in the central part of this device hole 8. The dimension of device hole 8 is vertical×horizontal=0.8 mm×0.8 mm, for example, and the dimension of chip 5 is vertical×horizontal=0.48 mm×0.48 mm.

As shown in FIG. 6, on the main surface of chip 5, four Au (gold) bumps 9a, 9b, 9c, and 9d are formed, for example. Lead 10 which is formed in one with antenna 3 and whose end extends and exists inside device hole 8 is connected to each of these Au bumps 9a, 9b, 9c, and 9d.

Among leads 10 of above-mentioned four, leads 10 of two extend and exist inside device hole 8 from one side of antenna 3 divided into two by slit 7, and are electrically connected with Au bumps 9a and 9c of chip 5. Leads 10 of remaining two extend and exist inside device hole 8 from another side of antenna 3, and are electrically connected with Au bumps 9b and 9d of chip 5.

Figure 8:
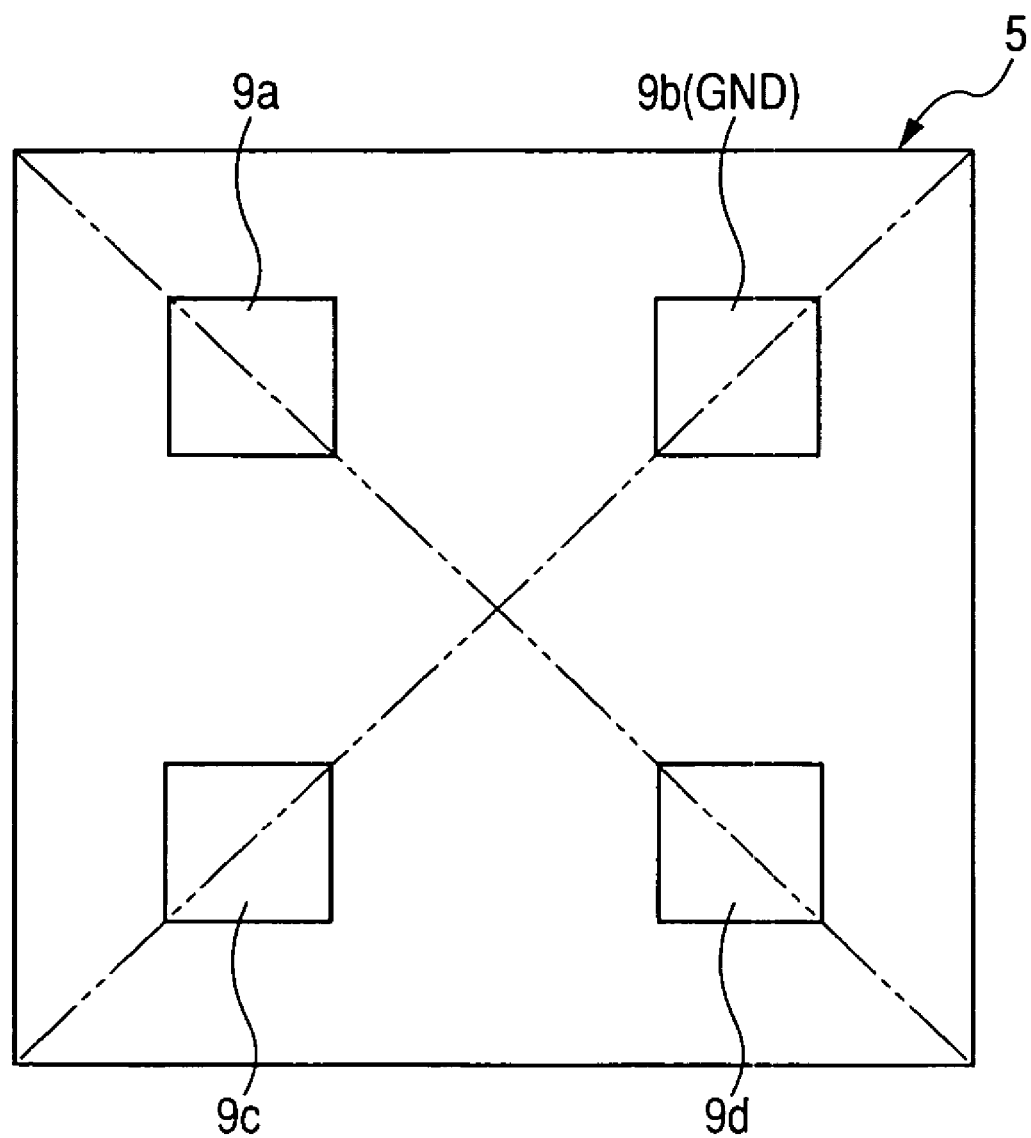
FIG. 8 is a plan view of the semiconductor chip mounted in the inlet for electronic tags which is an electronic device of Embodiment 1 of the present invention.
Figure 9:
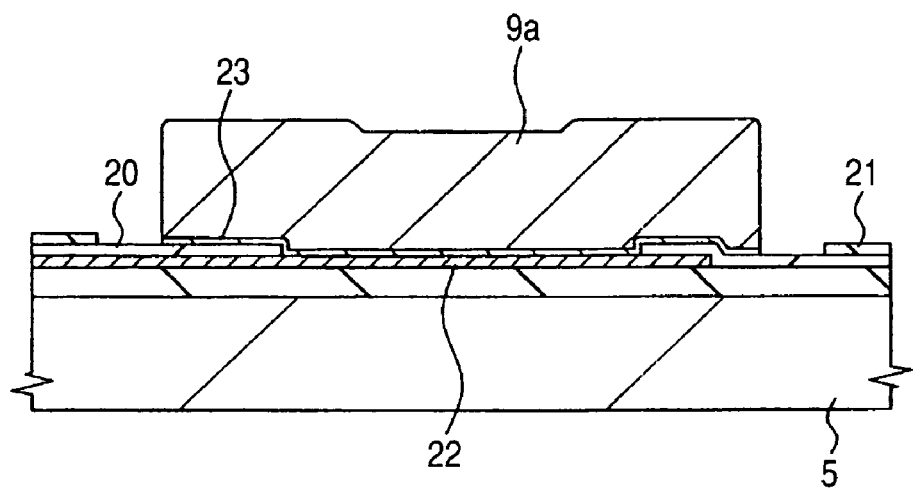
FIG. 9 is a cross-sectional view of the bump electrode formed on the main surface of the semiconductor chip shown in FIG. 8, and its neighborhood.
Figure 10:
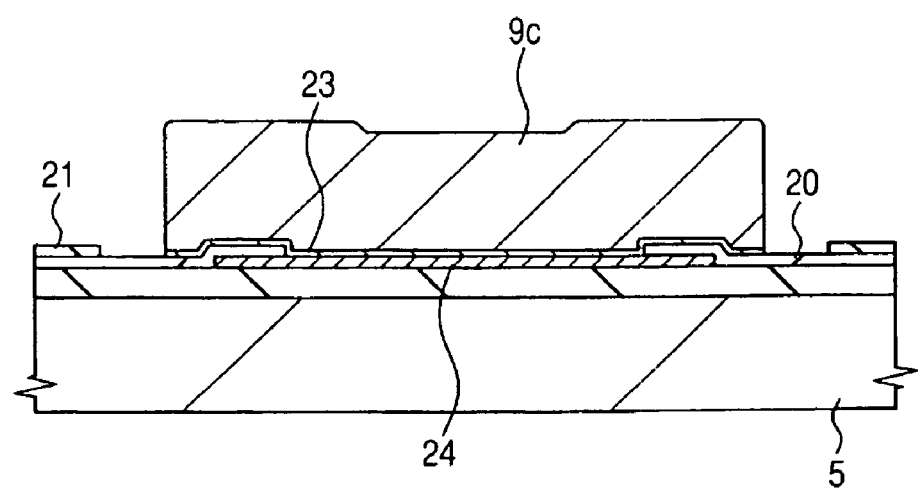
FIG. 10 is a cross-sectional view of the dummy bump electrode formed on the main surface of the semiconductor chip shown in FIG. 8, and its neighborhood.
Figure 11:
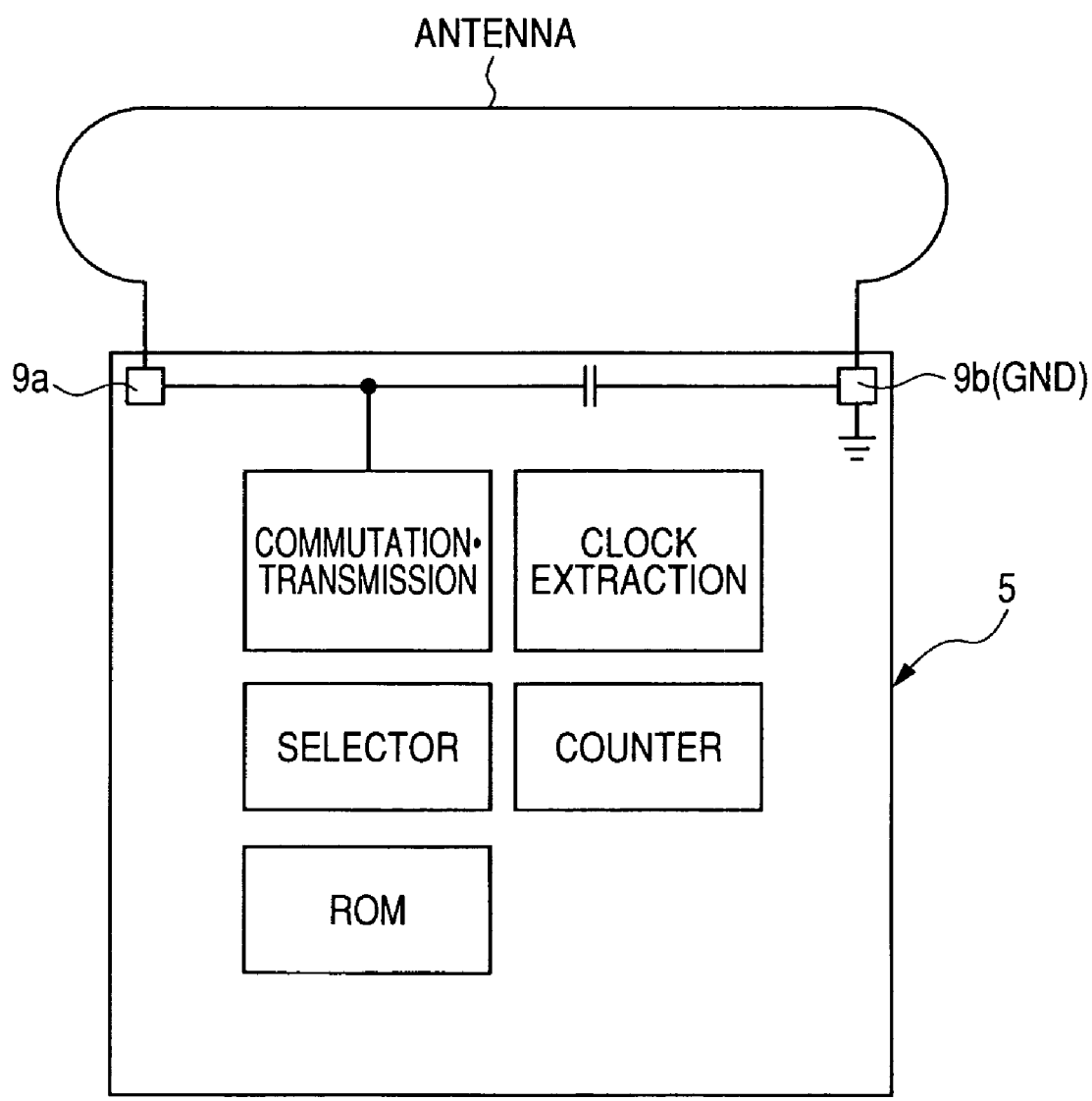
FIG. 11 is a block diagram of the circuit formed in the main surface of the semiconductor chip shown in FIG. 8.

FIG. 8 is a plan view showing four Au bumps' 9a, 9b, 9c, and 9d layout formed in the main surface of the above-mentioned chip 5, FIG. 9 is an enlarged sectional view near the Au bump 9a, FIG. 10 is an enlarged sectional view near the Au bump 9c, and FIG. 11 is a block diagram of the circuit formed in chip 5.

Chip 5 includes a single crystal silicon substrate of thickness=about 0.15 mm, and the circuits which include commutation and transmission, clock extraction, a selector, a counter, a ROM, etc. as shown in FIG. 11 are formed in the main surface. ROM has the memory capacity of 128 bits and can memorize mass data compared with storage media, such as a bar code. There is an advantage that an unjust alteration is difficult for the data which ROM was made to memorize compared with the data which the bar code was made to memorize.

On the main surface of chip 5 with which the above-mentioned circuits were formed, four Au bumps 9a, 9b, 9c, and 9d are formed. These four Au bumps 9a, 9b, 9c, and 9d are located on the imagination diagonal line of a pair shown with the two-dot chain line of FIG. 8, and they are arranged so that the distance from the intersection (the center of the main surface of chip 5) of these diagonal lines may become almost equal. These Au bumps 9a, 9b, 9c, and 9d were formed, for example using the electrolysis electroplating method, and the height is about 15 $\mu$m, for example.

Although the layout of these Au bumps 9a, 9b, 9c, and 9d is not restricted to the layout shown in FIG. 8, it is preferred that it is a layout which is easy to maintain balance to the load at the time of chip connection. For example, it is preferred to arrange so that the polygon formed by Au bump's tangent may surround the center of the chip in a plane layout.

Among the four above-mentioned Au bumps 9a, 9b, 9c, and 9d, Au bump 9a forms the input terminal of the circuits shown in the FIG. 11, and Au bump 9b forms the GND terminal. Remaining two Au bumps 9c and 9d form the bump of the dummy which is not connected to the above-mentioned circuits.

As shown in FIG. 9, Au bump 9a which forms the input terminal of the circuits is formed on top layer metal wiring 22 which was exposed etching passivation film 20 and polyimide resin 21 which cover the main surface of chip 5. Between Au bump 9a and top layer metal wiring 22, barrier metal film 23 for heightening both adhesion force is formed. Passivation film 20 includes a laminated film of a silicon oxide film and a silicon nitride film, for example, and top layer metal wiring 22 includes an aluminum alloy film, for example. Barrier metal film 23 includes a laminated film of Ti film with high adhesion force over an aluminum alloy film, and Pd film with high adhesion force to Au bump 9a, for example. Although illustration is omitted, the connecting part of Au bump 9b which forms the GND terminal of the circuits, and top layer metal wiring 22 also has the same structure as the above. On the other hand, as shown in FIG. 10, Au bump 9c (and 9d) which forms a dummy bump is connected to metal layer 24 formed in the same wiring layer as the above-mentioned top layer metal wiring 22, but this metal layer 24 is not connected to the circuits.

Thus, as for inlet 1 of Embodiment 1, slit 7 whose end arrives at the outer edge of antenna 3 is formed in a part of antennas 3 formed in one side of insulating film 2, the input terminal (Au bump 9a) of chip 5 is connected to one side of antenna 3 divided into two by this slit 7, and the GND terminal (Au bump 9b) of chip 5 is connected to the other side. The miniaturization of inlet 1 can be aimed at securing required antenna length by this structure, since the effectual length of antenna 3 can be lengthened.

In inlet 1 of Embodiment 1, Au bumps 9a and 9b which form the terminals of the circuits, and dummy Au bumps 9c and 9d are formed on the main surface of chip 5, and these four Au bumps 9a, 9b, 9c, and 9d are connected to lead 10 of antenna 3. Since the effectual contact area of Au bump and lead 10 becomes large by this structure compared with the case where only two Au bumps 9a and 9b connected to the circuits are connected to lead 10, the adhesive strength of Au bump and lead 10, i.e., both connection reliability, improves. By arranging four Au bumps 9a, 9b, 9c, and 9d on the main surface of chip 5 with a layout as shown in FIG. 8, when lead 10 is connected to Au bumps 9a, 9b, 9c, and 9d, chip 5 does not incline to insulating film 2. Hereby, since chip 5 can be surely sealed by potting resin 4, the manufacturing yield of inlet 1 improves.

Next, the manufacturing method of inlet 1 formed as mentioned above is explained using FIG. 12-FIG. 25.

Figure 12:
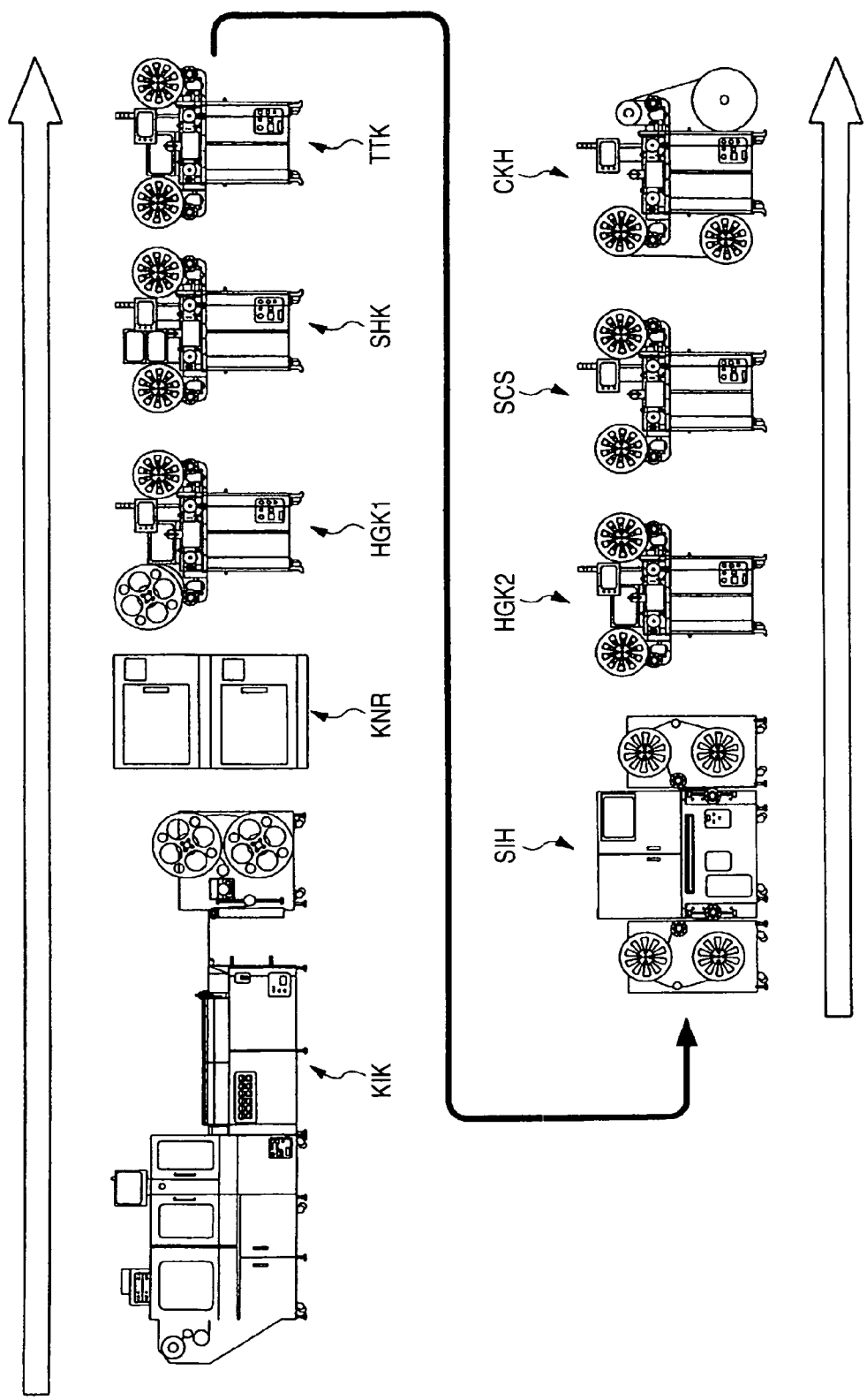
FIG. 12 is an explanatory drawing putting in order and showing the various apparatus used for manufacture of the inlet for electronic tags which is an electronic device of Embodiment 1 of the present invention along the manufacturing process of the inlet for electronic tags.
Figure 13:
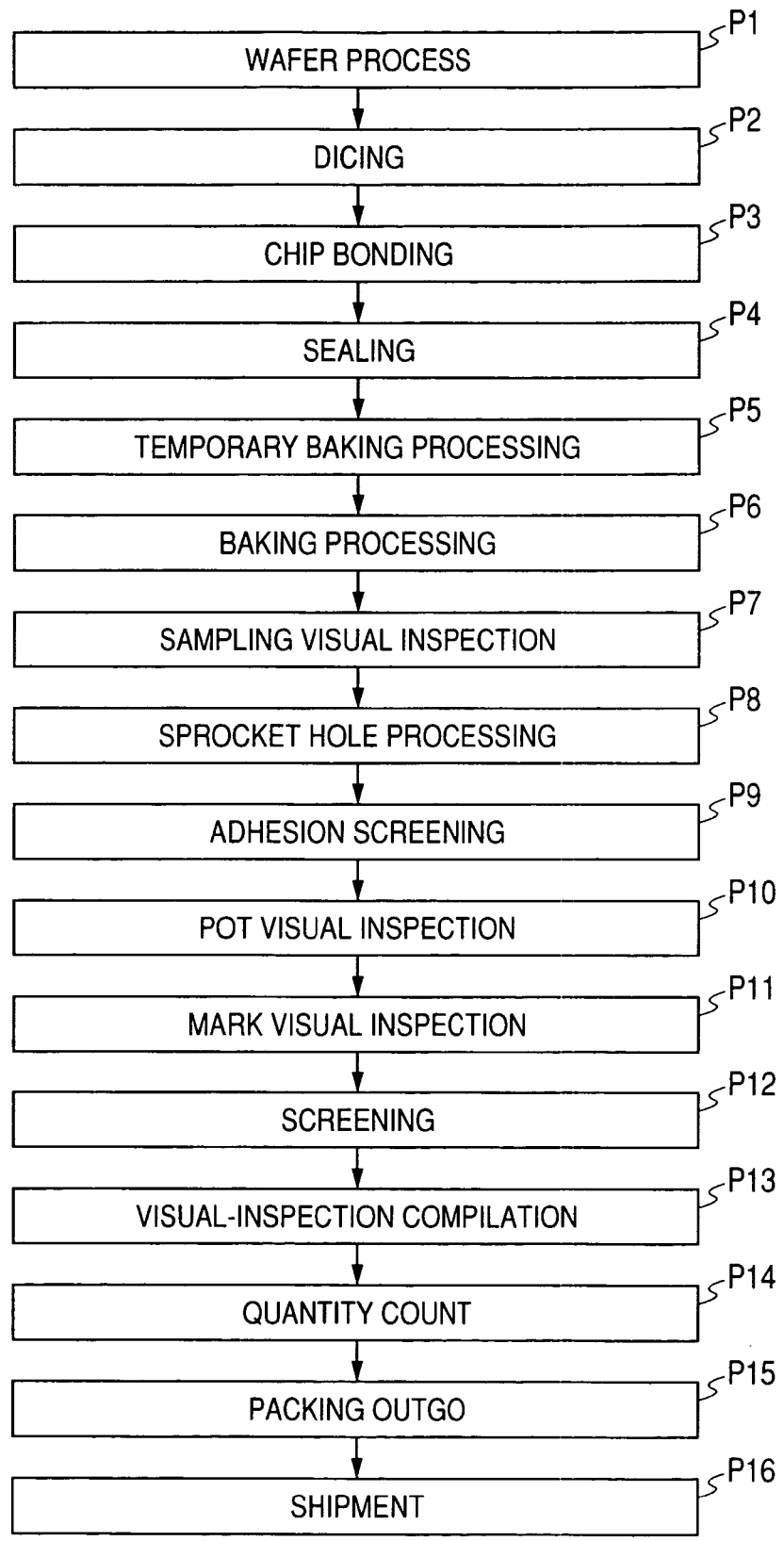
FIG. 13 is a flowchart explaining the manufacturing process of the inlet for electronic tags which is an electronic device of Embodiment 1 of the present invention.

FIG. 12 is an explanatory drawing having arranged and showing the various apparatus used for manufacture of the above-mentioned inlet 1 along the manufacturing process of inlet 1, and FIG. 13 is a flowchart explaining the manufacturing process of the above-mentioned inlet 1.

First, the wafer process which forms a semiconductor element, an integrated circuit, the above-mentioned bump electrodes 9a-9d, etc. on the main surface of a wafer form semiconductor substrate (it is only hereafter described as a substrate) is carried out (step P1). Then, the above-mentioned chip 5 is formed, dividing the wafer form substrate into chips by dicing (step P2).

Figure 14:
FIG. 14 is a plan view showing a part of long insulating films used for manufacture of the inlet for electronic tags which is an electronic device of Embodiment 1 of the present invention.
Figure 15:
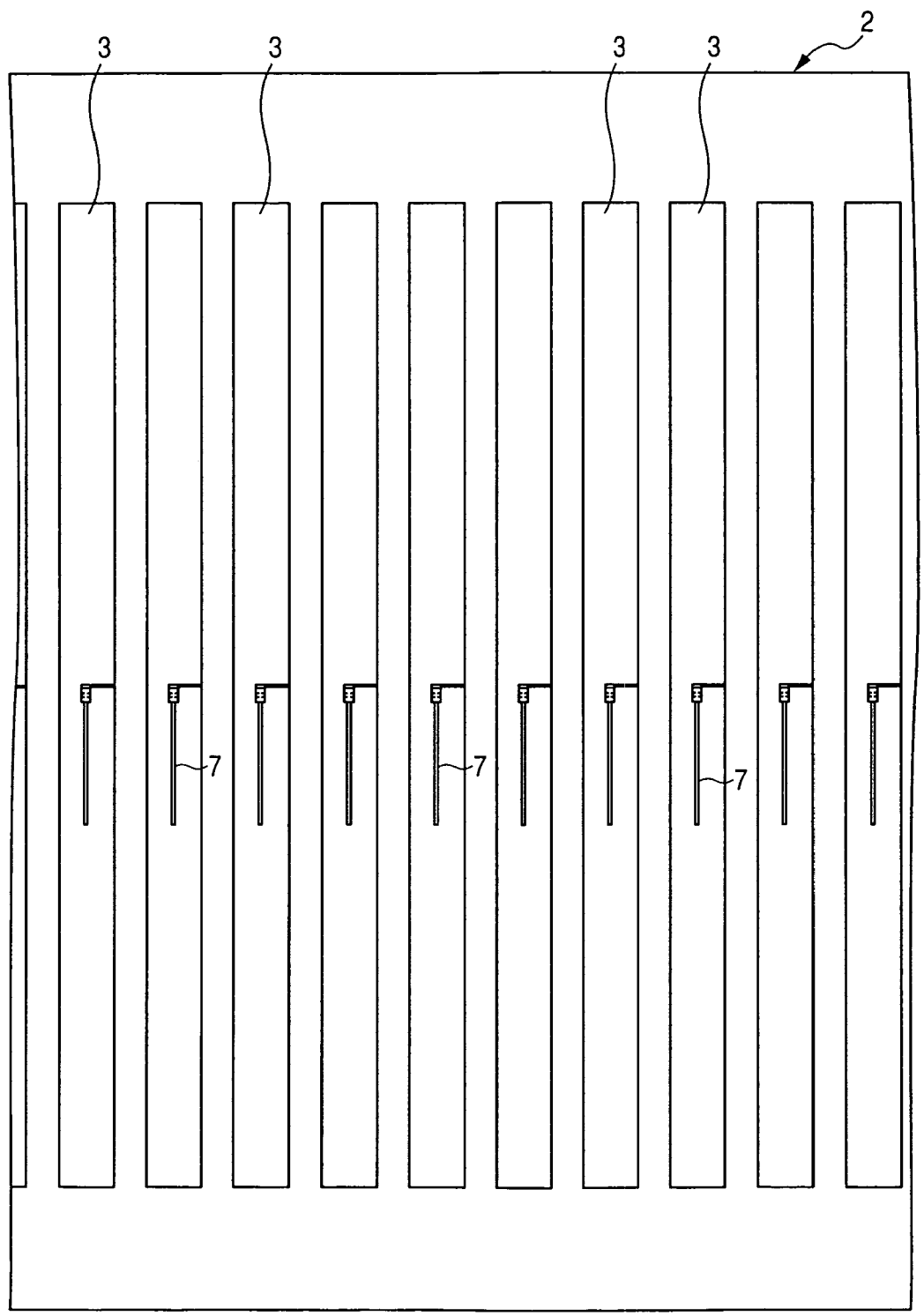
FIG. 15 is a plan view expanding and showing a part of insulating films shown in FIG. 14.

FIG. 14 is a plan view showing insulating film 2 used for manufacture of inlet 1, and FIG. 15 is a plan view expanding and showing an part of FIG. 14.

As shown in FIG. 14, insulating film 2 of continuation tape form is carried in to the manufacturing process of inlet 1 after having been rolled round by reel 25. Many antennas 3 are beforehand formed in one side of this insulating film 2 at the predetermined interval. In order to form these antennas 3, the Al foil of the thickness of about 20 $\mu$m is adhered, for example on one side of insulating film 2, and this Al foil is etched into the configuration of antenna 3. At this time, slit 7 and lead 10 which were mentioned above are formed at each antenna 3. Insulating film 2 is a thing according to the standard of the film carrier tape, and includes a film made of polyethylene terephthalate of width 50 mm or 70 mm, and thickness 25 $\mu$m, for example. Thus, by forming antenna 3 from Al foil and forming insulating film 2 from polyethylene terephthalate, the material cost of inlet 1 can be reduced compared with the case where antenna 3 is formed from Cu foil and insulating film 2 is formed from polyimide resin, for example.

Subsequently, distinguishing marks for identifying a kind, such as a part number of inlet 1, are given to the surface in which chip 5 is mounted of antenna 3. This distinguishing mark can be formed by the marking method which used the laser, for example.

Figure 16:
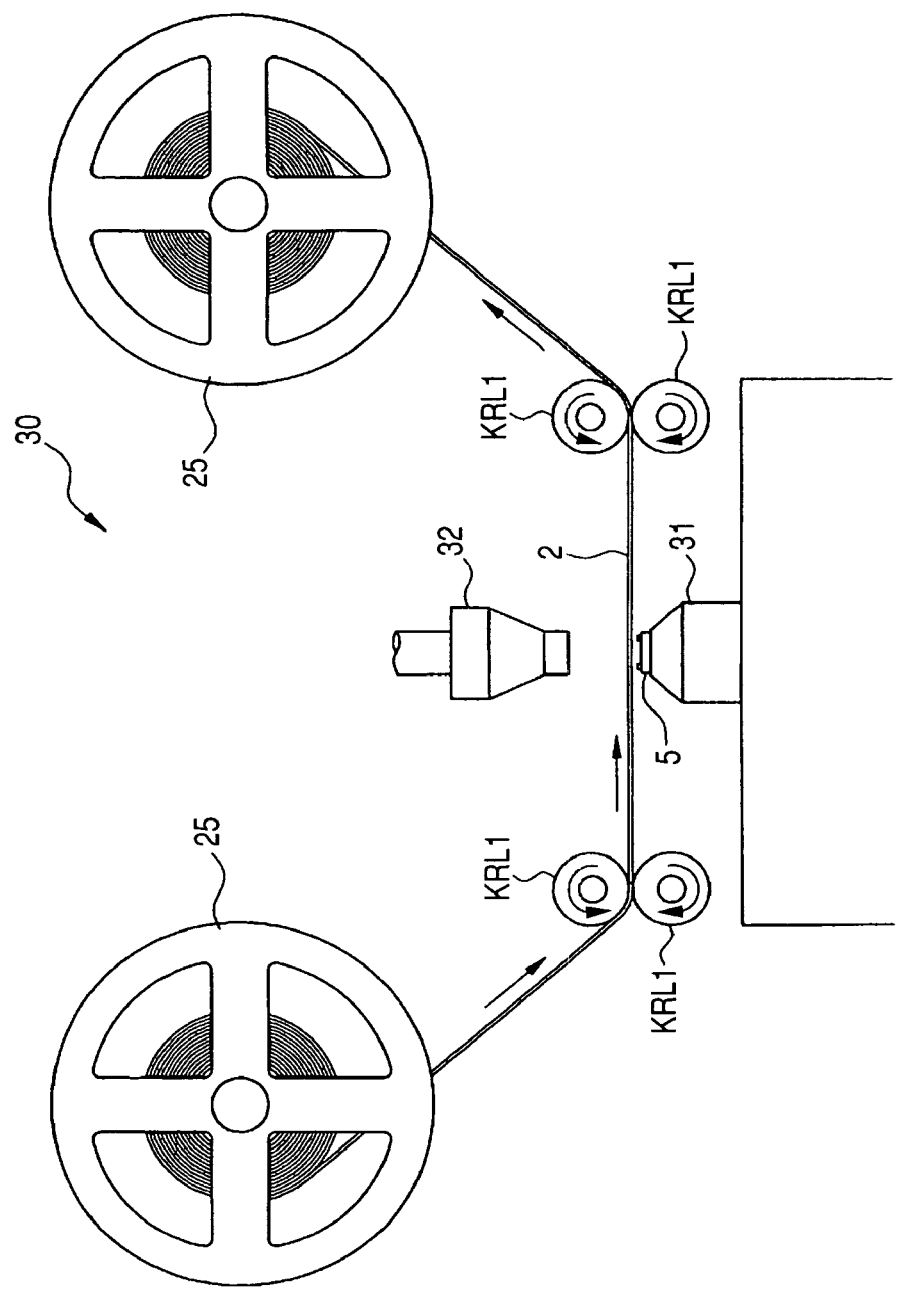
FIG. 16 is a schematic diagram of an inner lead bonder showing a part of manufacturing process (connection step of a semiconductor chip and an antenna) of the inlet for electronic tags which is an electronic device of Embodiment 1 of the present invention.

Next, as shown in FIG. 16, inner lead bonder 30 provided with bonding stage 31 and bonding tool 32 included in assembly consistent machine KIK is equipped with reel 25, and chip 5 is connected to antenna 3, moving insulating film 2 along the upper surface of bonding stage 31 (step P3).

The thing of the standard that a dimension, and operation of a rotating speed etc. are the same is used for drive roller KRL1 by which insulating film 2 is moved by two as one unit, two drive rollers KRL1 sandwich insulating film 2, and they move insulating film 2 by frictional force. The whole of four drive rollers KRL1 shown in FIG. 16 is a thing of the same standard. In moving insulating film 2, by applying such a method, thin insulating film 2 can also be dealt with, and there are few damages to insulating film 2, and they can do high-speed transportation of the insulating film 2. Drive roller KRL1 obtains power from the pulse motor which is not shown in FIG. 16, and it operates.

Figure 17:
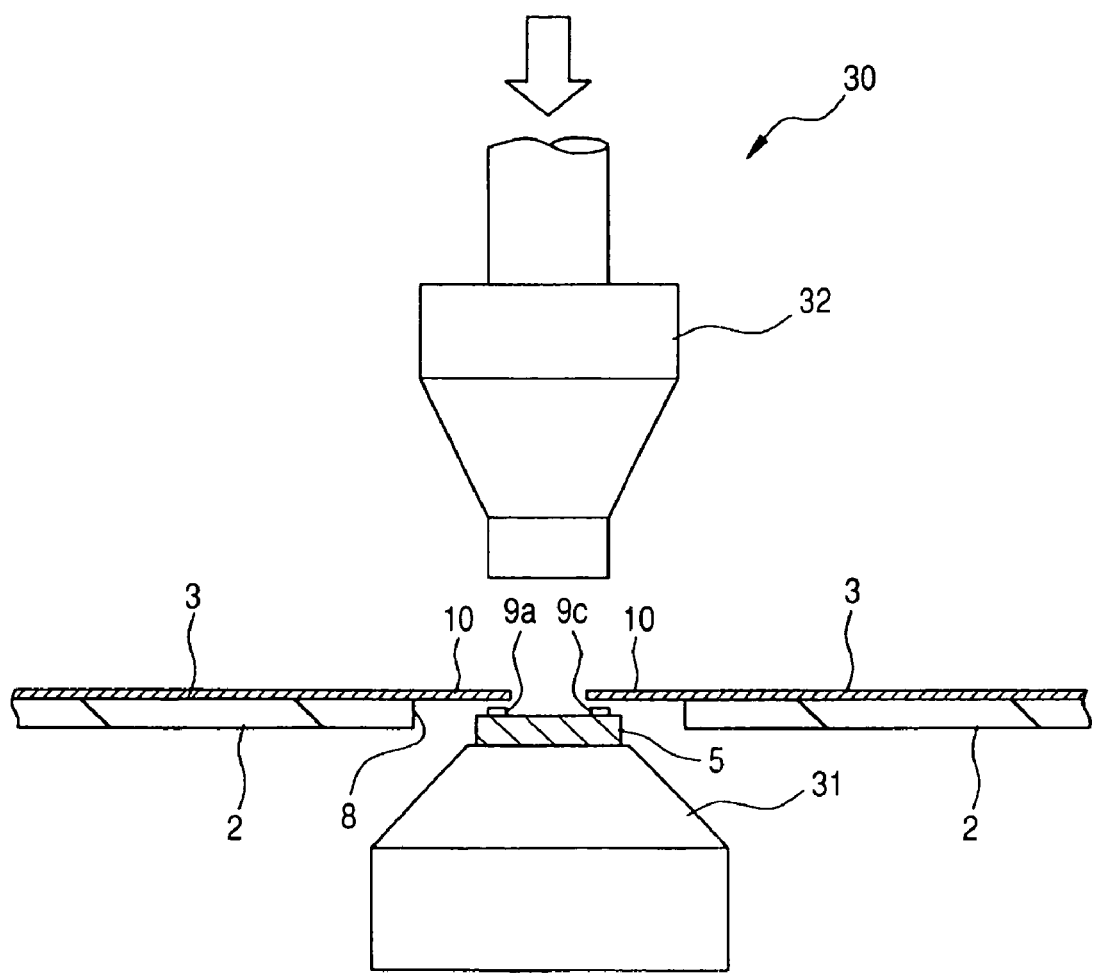
FIG. 17 is a schematic diagram expanding and showing the principal part of the inner lead bonder shown in FIG. 16.

As shown in FIG. 17 (principal part enlarged view of FIG. 16), in order to connect chip 5 to antenna 3, after mounting chip 5 on bonding stage 31 heated to about 80° C. and positioning device hole 8 of insulating film 2 right above this chip 5, bonding tool 32 heated to about 350° C. is pressed against the upper surface of lead 10 projected inside device hole 8, and lead 10 is contacted by Au bump (9a-9d). At this time, by applying a predetermined supersonic wave and a predetermined load to bonding tool 32 about 0.1 second, Au/Al junction is formed in the interface of lead 10 and Au bump (9a-9d), and Au bump (9a-9d) and lead 10 adhere mutually.

Next, after mounting new chip 5 on bonding stage 31 and moving insulating film 2 by one pitch of antenna 3 continuously, this chip 5 is connected to antenna 3 by performing the same operation as the above. Henceforth, chip 5 is connected to all the antennas 3 formed in insulating film 2 by repeating the same operation as the above. Insulating film 2 to which the connection work of chip 5 and antenna 3 is completed is transported to the following resin seal step after having been rolled round by reel 25.

Figure 18:
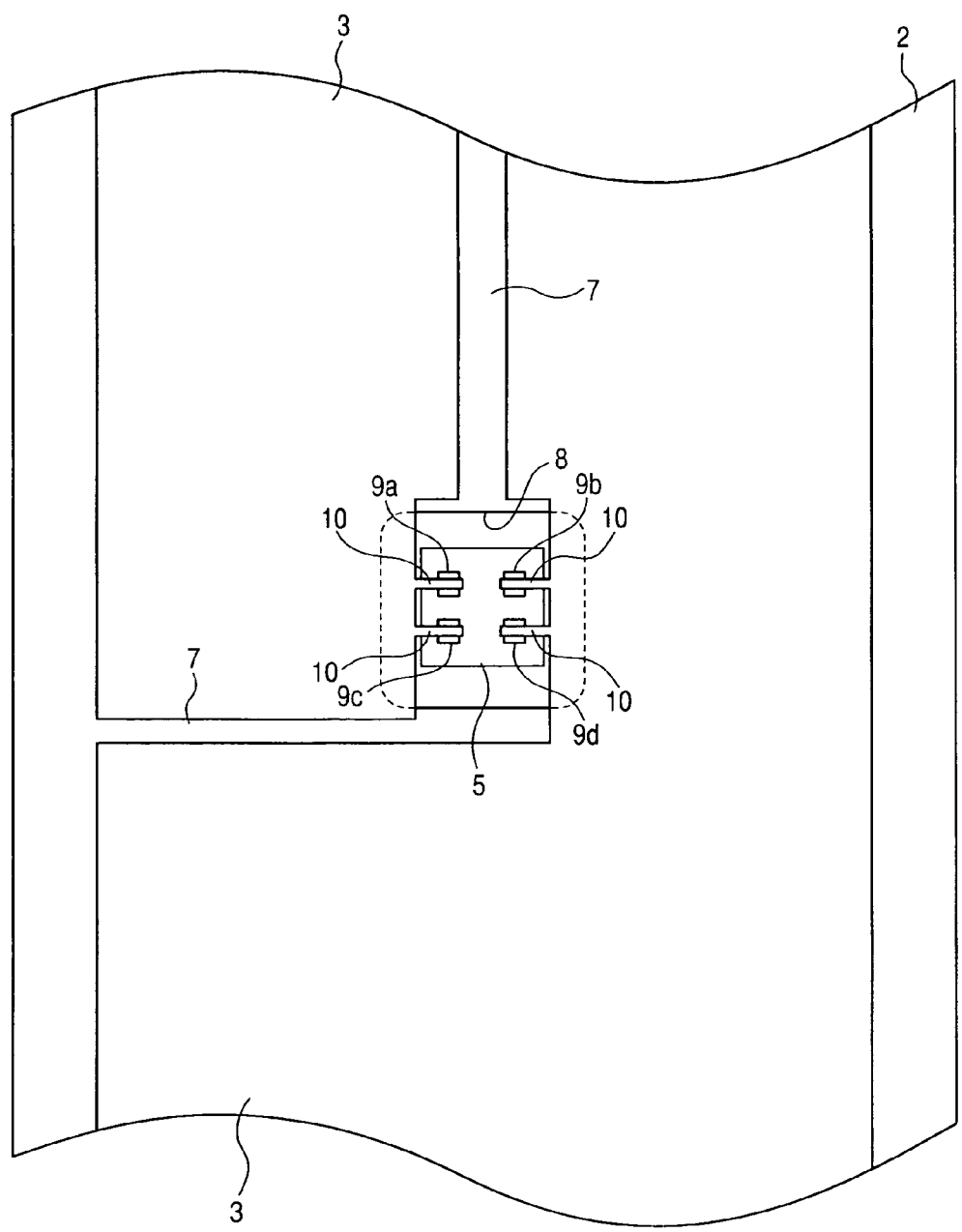
FIGS. 18 and 19 are principal part enlarged plan views of an insulating film showing a part of manufacturing process (connection step of a semiconductor chip and an antenna) of the inlet for electronic tags which is an electronic device of Embodiment 1 of the present invention.
Figure 19:
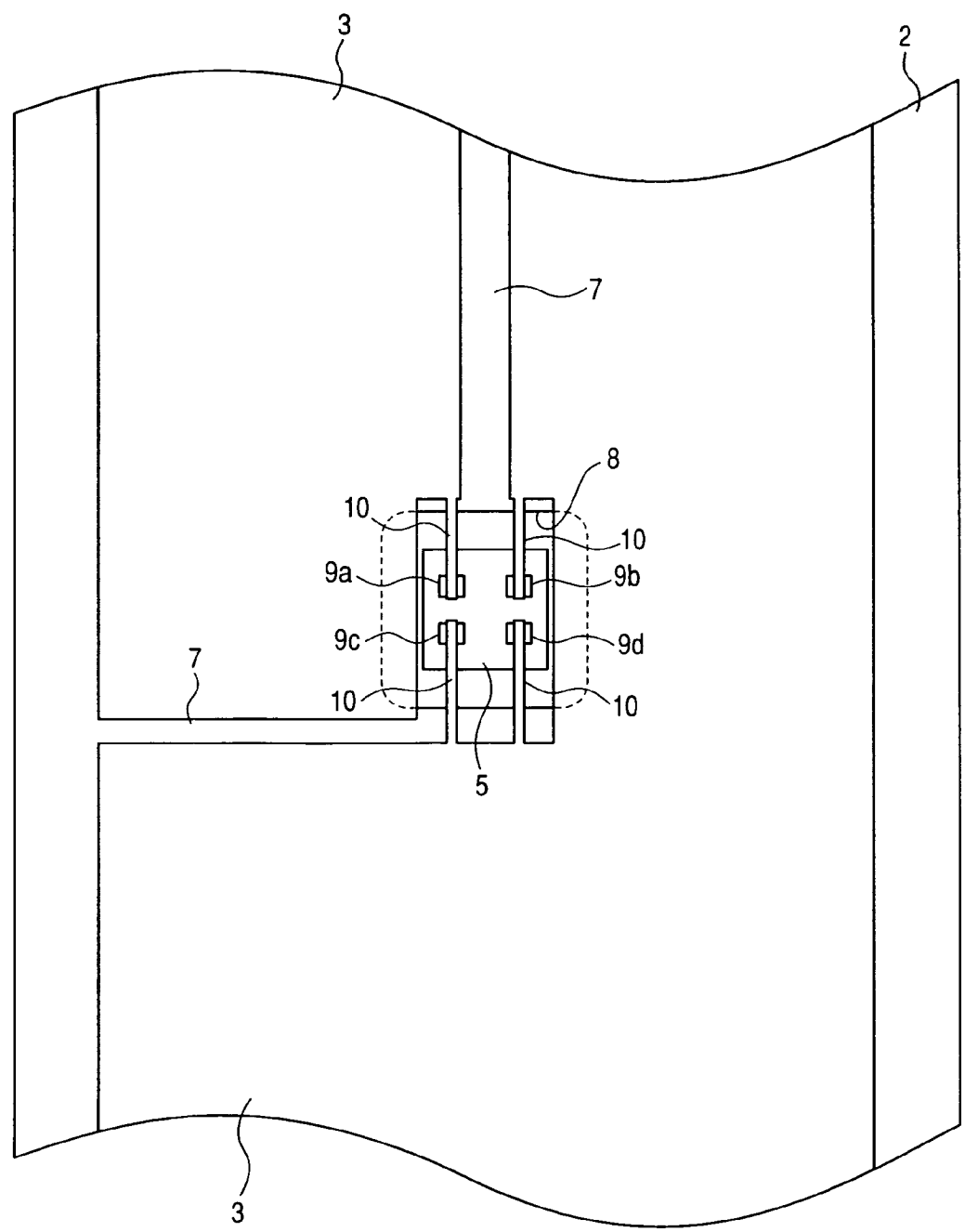

In order to improve the connection reliability of Au bump (9a-9d) and lead 10, it is better to make lead 10 of four extend and exist in the direction which intersects perpendicularly with the long side direction of antenna 3, as shown in FIG. 18. Since a strong tensile stress works to the junction of Au bump (9a-9d) and lead 10 when lead 10 of four is made to extend and exist in parallel with the long side direction of antenna 3 and completed inlet 1 is bent, as shown in FIG. 19, there is a possibility that both connection reliability may fall.

Figure 20:
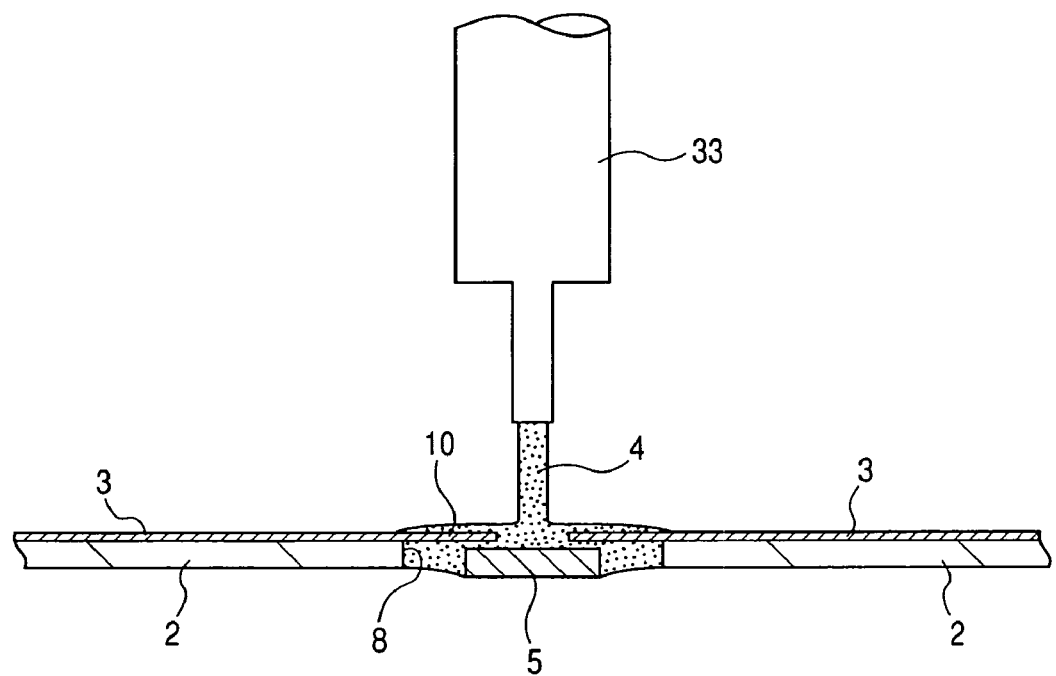
FIG. 20 is a schematic diagram showing a part of manufacturing process (resin seal step of a semiconductor chip) of the inlet for electronic tags which is an electronic device of Embodiment 1 of the present invention.
Figure 21:
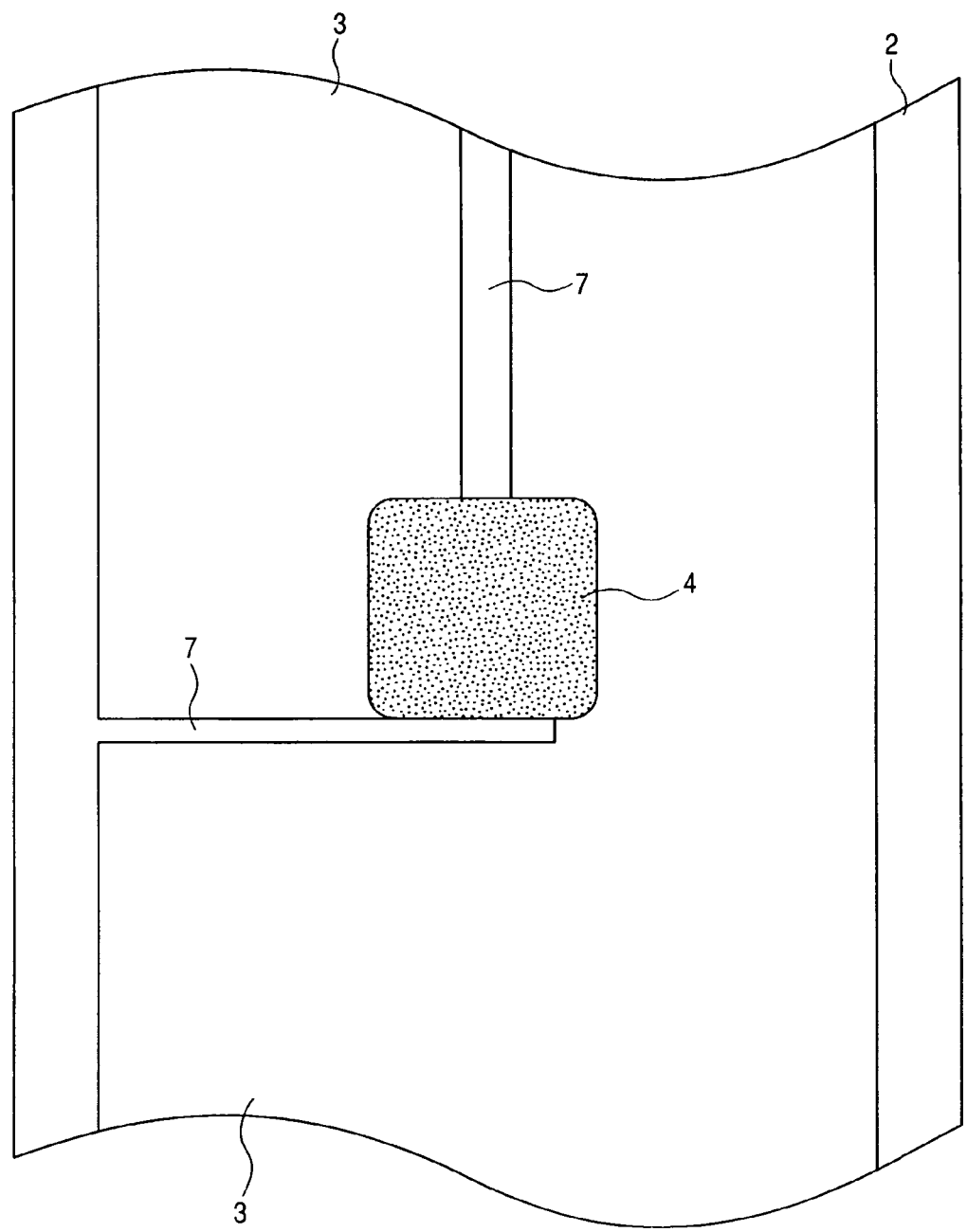
FIG. 21 is a principal part enlarged plan view of an insulating film showing a part of manufacturing process (resin seal step of a semiconductor chip) of the inlet for electronic tags which is an electronic device of Embodiment 1 of the present invention.
Figure 22:
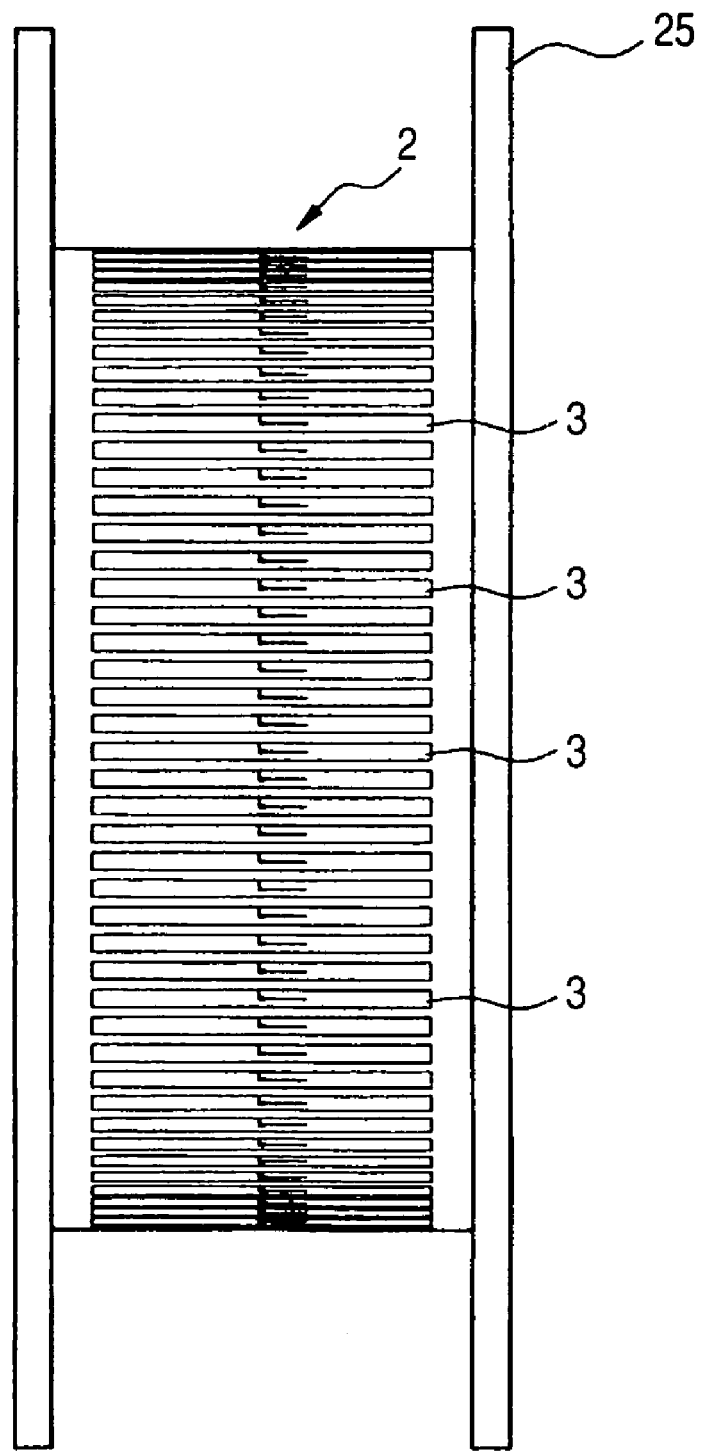
FIG. 22 is a side view showing the state where the insulating film used for manufacture of the inlet for electronic tags which is an electronic device of Embodiment 1 of the present invention was rolled round to the reel.

At the resin seal step of chip 5, as shown in FIG. 20 and FIG. 21, potting resin 4 is supplied to the upper surface and the side face of chip 5 mounted inside device hole 8 using dispenser 33 included in assembly consistent machine KIK (step P4). Subsequently, temporary baking processing is performed by about 120° C. to potting resin 4 in the heating furnace formed in assembly consistent machine KIK (step P5). Although illustration is omitted, also in this resin seal step, feeding and temporary baking processing of potting resin 4 are performed, moving insulating film 2. As shown in FIG. 22, insulating film 2 to which feeding and temporary baking processing of potting resin 4 are completed is transported to heating furnace KNR with which the next baking processing is performed after having been rolled round by reel 25, and baking processing is performed by about 120° C. (step P6).

Insulating film 2 to which the above-mentioned baking processing is completed is transported to semiautomatic visual inspection apparatus HGK1, after having been rolled round by reel 25. Here, a sampling visual inspection is conducted to the structural body where chip 5 is mounted in antenna 3 and chip 5 is sealed with potting resin 4. Here, a visual inspection is conducted to not all structural bodies, but a visual inspection is conducted to the structural body of the predetermined number to which random sampling was done (step P7). That is, when an external appearance failure is found, with a manufacturing apparatus, material, etc. which were used by step P6, the part which has trouble in manufacture of inlet 1 is pinpointed, and the generation of trouble is prevented from the generation condition of an external appearance failure by feeding back to manufacture of subsequent inlets 1. External appearance failure which is said here includes one or more of adhesion of the debris to the structural body, the blemish generated in the structural body, the sealing failure (lack of wet) of potting resin 4, breakage such as chipping etc. of chip 5, the deformation that is not preferred of the structural body, and the recognition failure of the above-mentioned distinguishing mark formed (marked) in antenna 3. In the sampling visual inspection in this step P7, the detection of an external appearance failure by picture processing of semiautomatic visual inspection apparatus HGK1, the detection of an external appearance failure by an operator viewing the image with which extended projection is done to a checking monitor display, or those both can be chosen suitably.

Figure 23:
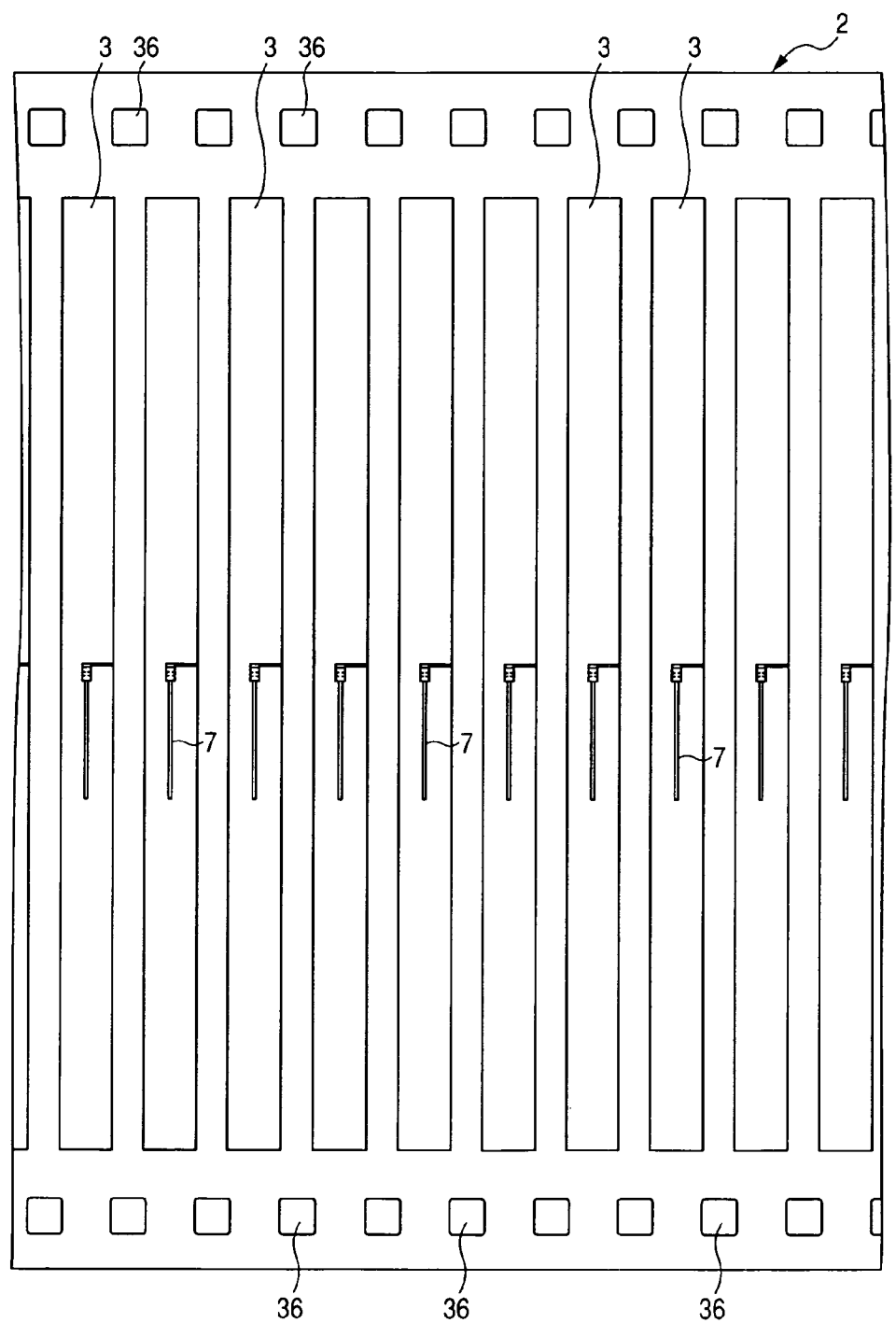
FIG. 23 is a plan view showing a part of long insulating films used for manufacture of the inlet for electronic tags which is an electronic device of Embodiment 1 of the present invention.

Subsequently, when there is a request from a customer, sprocket hole 36 for transporting insulating film 2 as shown in FIG. 23 is formed in the both side parts of insulating film 2 at the predetermined interval with sprocket hole opening machine SHK (step P8). Sprocket hole 36 can be formed by punching a part of insulating films 2 by punch. On the other hand, when not forming such a sprocket hole 36, the cost (about 1 yen doing one lot (two pieces) formation of the sprocket hole 36 of the ends of insulating film 2) which formation of sprocket hole 36 takes can be reduced.

Figure 24:
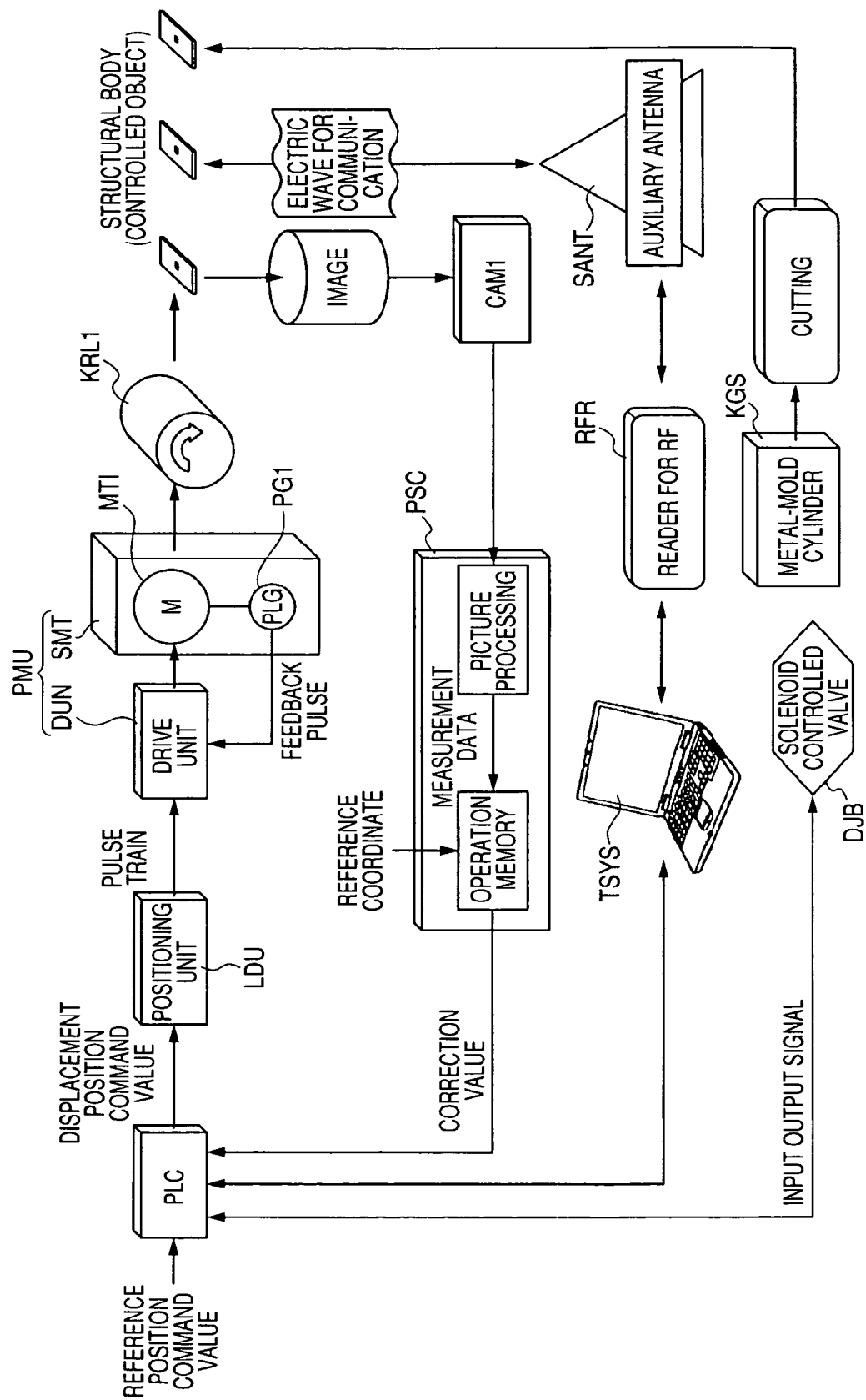
FIG. 24 is an explanatory drawing showing the flow of each step in the communication characteristic test in the manufacturing process of the inlet for electronic tags which is an electronic device of Embodiment 1 of the present invention.
Figure 25:
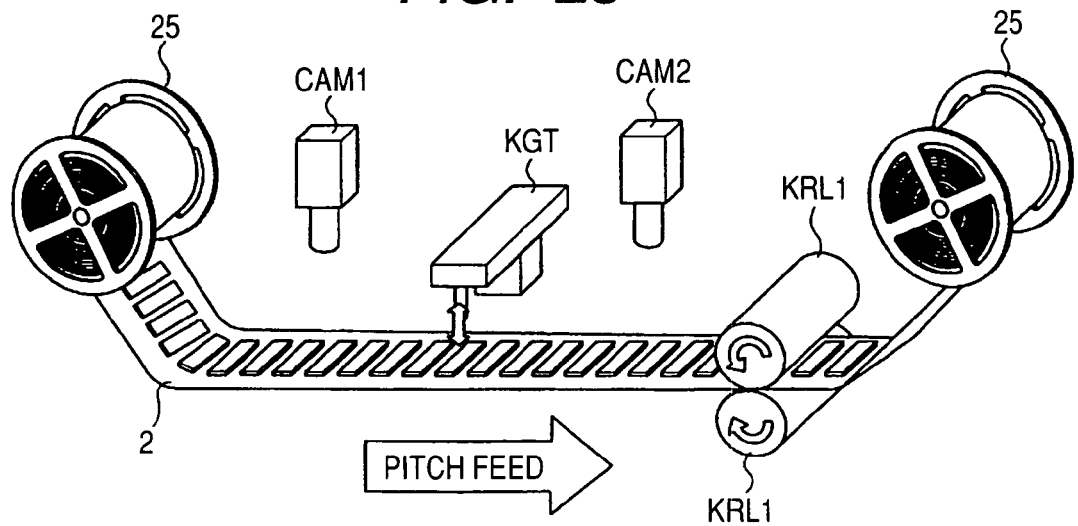
FIG. 25 is an explanatory drawing showing the motion of each instrument and member in the principal part at the time of the communication characteristic test in the manufacturing process of the inlet for electronic tags which is an electronic device of Embodiment 1 of the present invention.

Subsequently, a communication characteristic test is conducted to each of the above-mentioned structural body used as inlet 1 by communication characteristic test equipment TTK (step P9). Here, FIG. 24 is an explanatory drawing showing the flow of each step at the time of the communication characteristic test, and FIG. 25 is an explanatory drawing showing the motion of each instrument and member in the principal part of communication characteristic test equipment TTK at the time of the communication characteristic test.

At the time of the communication characteristic test, first, the first thing (first structural body) of the above-mentioned structural body is moved to the location (first location (it is hereafter described as an inspection position)) where the above-mentioned communication characteristic test is carried out, and the communication characteristic test (first process) is carried out. In Embodiment 1, the communication characteristic test is conducted using the so-called adhesion handler, and where the distance of the structural body to be examined and auxiliary antenna SANT is kept constant, the communication characteristic is measured. The structural body to which the communication characteristic test is performed is shielded in between the adjoining structural body by the slit etc. which shields an electric wave, and the electric wave for test which was emitted from auxiliary antenna SANT is tried not to be received accidentally by the adjoining structural body. Test system TSYS which includes a computer etc. analyzes the communication result between the structural body via auxiliary antenna SANT, and reader RFR for RF (Radio Frequency), performs the quality judging of the communication characteristic of the structural body to which the communication characteristic test was performed, and transmits the result to programmable-controller PLC.

Figure 26:
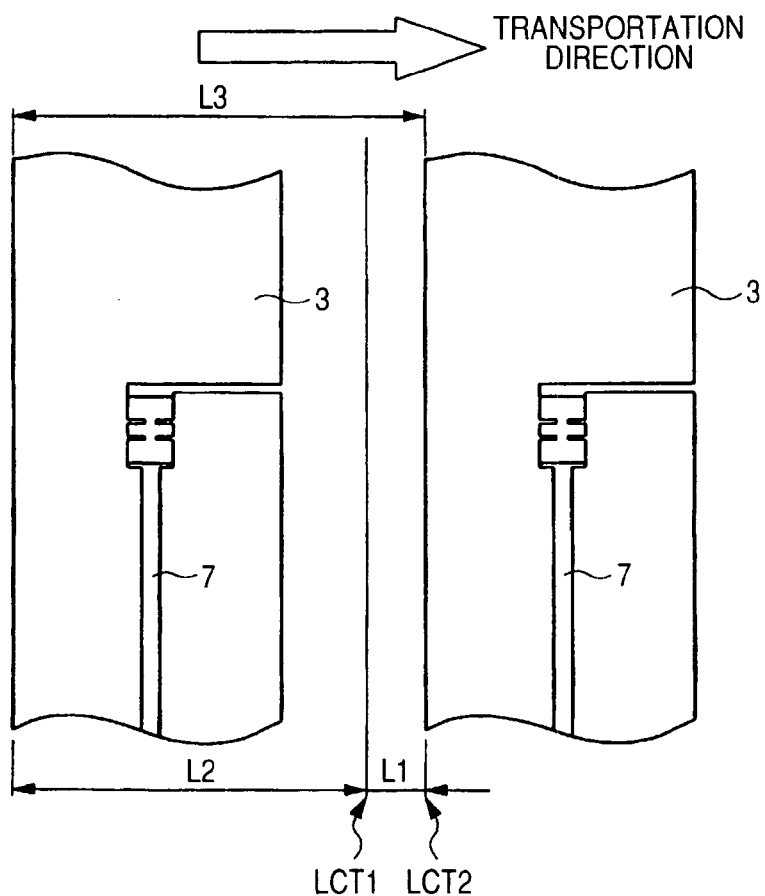
FIG. 26 is a plan view expanding and showing the principal part of the insulating film in the manufacturing process of the inlet for electronic tags which is an electronic device of Embodiment 1 of the present invention.
Figure 27:
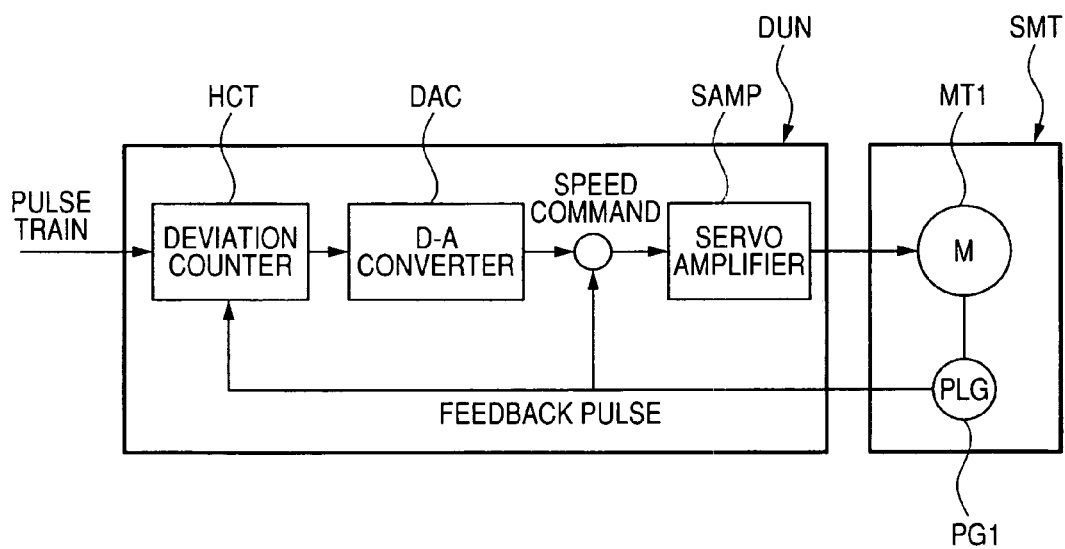
FIG. 27 is an explanatory drawing showing the structure of the pulse motor unit used in the manufacturing process of the inlet for electronic tags which is an electronic device of Embodiment 1 of the present invention.

In the above-mentioned inspection position, CCD (Charge Coupled Device) camera CAM1 photos the plane image (first image) of the structural body in the location, and it transmits image data to image sensor controller PSC. Image sensor controller PSC analyzes the image data transmitted from CCD cameraCAM1. Distance L1 (refer to FIG. 26) (the first amount of drifts) between coordinates LCT1 (refer to FIG. 26) at which the reference position of the structural body which is a controlled object (object of a communication characteristic test) has stopped, and coordinates LCT2 (refer to FIG. 26) at which the reference position must stop essentially is measured. In Embodiment 1, about reference position and coordinates LCT2 of the structural body which is a controlled object (object of a communication characteristic test), it is possible to set up arbitrarily and response is possible also for delicate positioning in an instant. Image sensor controller PSC transmits to programmable-controller PLC by making this distance L1 into a correction value. Adjusting the correction value to movement magnitude (pitch movement magnitude (reference position command value)) L2 (refer to FIG. 26) of standard for making the following structural body (second structural body) currently formed continuously with the predetermined interval (first pitch) with the structural body of the above-mentioned controlled object move to the inspection position, programmable-controller PLC transmits to positioning unit LDU as actual movement magnitude (displacement position command value (first distance)) L3 (refer to FIG. 26). This positioning unit LDU is a pulse generator which sends the pulse wave which drives pulse motor unit PMU used as the driving source of drive roller KRL1 which transports insulating film 2 (structural body). The pulse train corresponding to the drive quantity in which drive roller KRL1 only transports insulating film 2 by the actual movement magnitude is sent. As shown in the FIG. 27 illustrating the structure of pulse motor unit PMU, pulse motor unit PMU includes servo-motor SMT which has motor MT1 and pulse generator PG1, and drive unit DUN which has deviation counter HCT, D/A (digital/analog) converter DAC, and servo amplifier SAMP. Pulse generator PG1 sends the feedback pulse proportional to the number of rotations of motor MT1. Deviation counter HCT holds the pulse train transmitted from positioning unit LDU, and the accumulated pulse computed from the feedback pulse, and determines the rotating speed of motor MT1 by this accumulated pulse. The revolution of motor MT1 is continued by maintaining fixed accumulated pulses, changing accumulated pulses into analog data in D/A-converter DAC, and transmitting to motor MT1 via servo amplifier SAMP. The feedback pulse is subtracted from the accumulated pulses at any time. When the pulse train transmitted from positioning unit LDU stops and accumulated pulses will decrease, the rotating speed of motor MT1 will become slow, and when accumulated pulses are set to 0, motor MT1 will stop. That is, an acceleration and deceleration speed, acceleration and deceleration speed time, etc. of motor MT1 can be arbitrarily set up by the accumulated pulse value, and the change in an accumulated pulse value. When drive roller KRL1 transports insulating film 2 under such structure corresponding to the pulse train sent from positioning unit LDU, the following structural body to be examined can be transported to the inspection position, canceling the effect of the location drift of the previous structural body to be examined in an inspection position. Thereby, the trouble that the structural body which adjoins the structural body to be examined will advance into an inspection position, and the communication characteristic test will be conducted to the adjoining structural body can be prevented. Since reflection and amendment are done at the time of the transportation to the inspection position of the following structural body, measuring the location drift at the inspection position for every structural body to be examined, the trouble that the location drift at the inspection position will become large as it becomes the later structural body, when the location drift at the inspection position accumulates can be prevented.

According to the above Embodiment 1, since insulating film 2 in which the structural body used as inlet 1 was formed is transported with the roller carrier system using drive roller KRL1, for example, high-speed transportation can be realized compared with a sprocket carrier system, and, moreover, the structural body to which a communication characteristic test is performed can be moved with sufficient accuracy to the inspection position.

By the way, since the width of antenna 3 differs for every inlet in forming inlet 1 from which a standard differs using one insulating film 2, movement magnitude (pitch movement magnitude (reference position command value)) L2 (refer to FIG. 26) of standard for making it move to the above-mentioned inspection position differs for every above-mentioned structural body formed on insulating film 2. In Embodiment 1, it is possible to set up the pitch movement magnitude L2 for every structural body. The above-mentioned correction value set up based on distance L1 (refer to FIG. 26) can be fed back to pitch movement magnitude L2 each time, and actual movement magnitude (displacement position command value) L3 (refer to FIG. 26) can be determined. That is, Embodiment 1 can be easily applied, even when forming inlet 1 from which a standard differs using one insulating film 2. Thereby, the manufacturing cost of inlet 1 of Embodiment 1 can be reduced.

As shown in FIG. 25, it can also have structure which removes chip 5 from a structural body by punching chip 5 with antenna 3 with metal mold (removing means) KGT which communication characteristic test equipment TTK has about the above-mentioned structural body judged in the above-mentioned communication characteristic test to be a defective unit. Opening of a predetermined diameter is formed in the structural body judged to be a defective unit at this time. In this case, the above-mentioned pitch movement magnitude (reference position command value) L2 is arranged so that all the above-mentioned structural bodies formed on insulating film 2 may be arranged in equal pitch. Metal mold KGT is arranged in the location which spaced out by the integral multiple (n times) of pitch movement magnitude L2 from the above-mentioned inspection position in the transportation direction of insulating film 2. After a structural body is judged to be a defective unit, the structural body judged to be a defective unit is transported under metal mold KGT by doing pitch transportation (pitch feed) of the insulating film 2 n times. In the meantime, about the structural body following the structural body judged to be a defective unit, a communication characteristic test is conducted one by one in the inspection position. When the structural body judged to be a defective unit moves to the location where metal mold KGT is arranged, programmable-controller PLC will send an output signal to solenoid controlled valve DJB, and will open solenoid controlled valve DJB. Thereby, air pressure is raised, metal-mold cylinder KGS which is an air driver is operated, metal mold KGT is descended, and chip 5 is punched with antenna 3. When a sensor detects the active position lower limit of metal-mold cylinder KGS, a detection signal will be transmitted to programmable-controller PLC from the sensor. Programmable-controller PLC which received the detection signal turns off the output signal to solenoid controlled valve DJB, and closes solenoid controlled valve DJB. Thereby, air pressure descends and metal mold KGT goes up. Thus, by having structure which removes chip 5 from the structural body judged in the communication characteristic test to be a defective unit, it becomes possible to punch chip 5 with exact accuracy of position, suppressing the location drift under metal mold KGT.

It is also good adopting the structure of counting each number of structural bodies of a non defective unit and a defective unit (first number, second number), by arranging CCD camera (first optical detecting means) CAM2 in the location (third location) which spaced out by the integral multiple (m times) of pitch movement magnitude L2 from the location where the above-mentioned metal mold KGT is arranged in the transportation direction of insulating film 2, photoing the plane image of a structural body by the CCD camera CAM2, and distinguishing automatically the existence of the above-mentioned opening in a structural body. Thereby, the location drift of a structural body at the camera station by CCD camera CAM2 is suppressed, and opening formed in the structural body can be distinguished, without doing erroneous recognition. That is, it becomes possible to count correctly each number of structural bodies of a non defective unit and a defective unit. It may be made to count each number of structural bodies of a non defective unit and a defective unit by the means using a laser beam instead of CCD camera CAM2.

Next, screening consistent handler SIH performs the visual inspection (step P10) of potting resin 4 (refer to FIG. 21), the visual inspection (step P11) of the distinguishing mark given to antenna 3, and the non defective unit screening (step P12) after passing through steps P10 and P11 one by one.

Then, in semiautomatic visual inspection apparatus HGK2, a visual inspection is conducted to all the above-mentioned structural bodies (step P13). The external appearance failure said here is the same as that of step P7 which used semiautomatic visual inspection apparatus HGK1. In the visual inspection in this step P13, the detection of an external appearance failure by picture processing of semiautomatic visual inspection apparatus HGK2, the detection of an external appearance failure by an operator viewing the image in which extended projection is done to a checking monitor display, or those both can be chosen suitably.

Subsequently, the above-mentioned number of structural bodies of a non defective unit and a defective unit final at quantity counter terminal SCS is investigated, respectively (step P14). Then, packing, and outgo of insulating film 2 rolled round by reel 25 are performed (step P15), and it is shipped to the customer side after that (step P16). In this case, each inlet 1 can be obtained by cutting insulating film 2 between antennas 3 by the customer side. According to a request of a customer, it may be shipped in the state where it is cut to each inlet 1 by the manufacture side (shipment side). Random sampling of the insulating film 2 of a predetermined number may be done after packing, and outgo of insulating film 2, and the same communication characteristic test as step P9 may be conducted by handler CKH for a check before shipment.

Embodiment 2

In Embodiment 2, the transportation method of insulating film 2 applied in the Embodiment 1 at step P9 (refer to FIG. 13, FIG. 24, and FIG. 25) is applied at the non defective unit screening step of step P12 (refer to FIG. 13).

Figure 28:
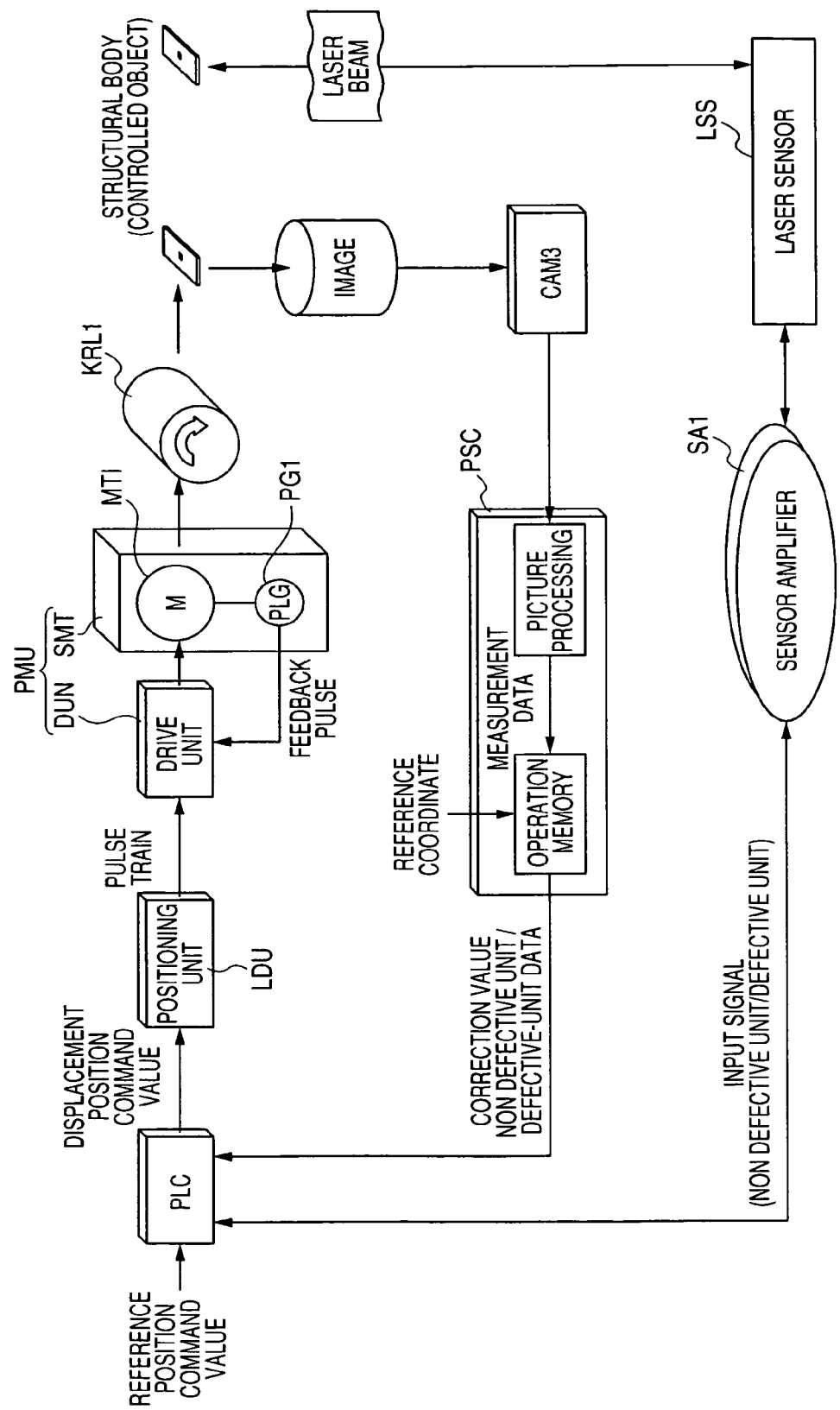
FIG. 28 is an explanatory drawing showing the flow of each step in the non defective unit screening step in the manufacturing process of the inlet for electronic tags which is an electronic device of Embodiment 2 of the present invention.
Figure 29:
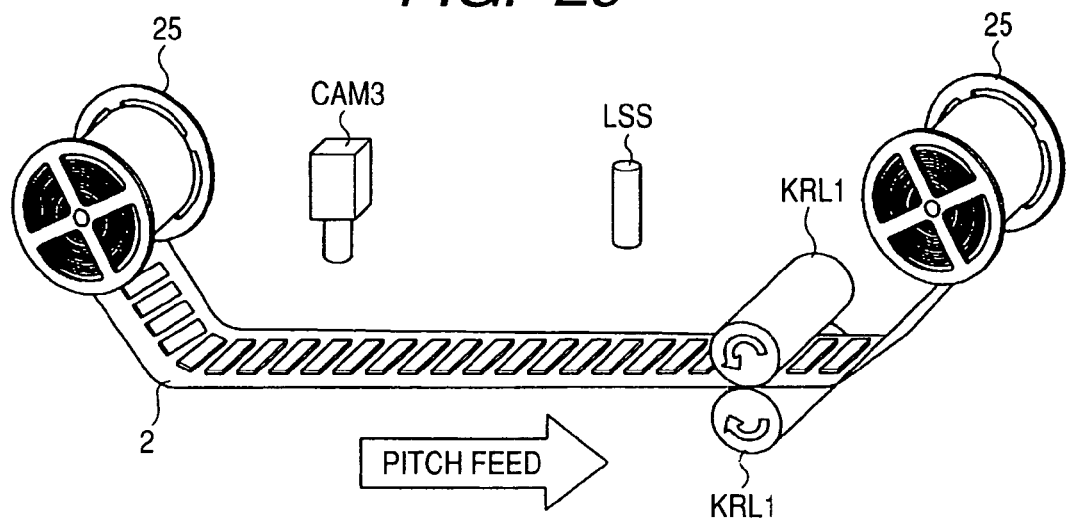
FIG. 29 is an explanatory drawing showing a motion of each instrument and member in the principal part at the time of the non defective unit screening step in the manufacturing process of the inlet for electronic tags which is an electronic device of Embodiment 2 of the present invention.

FIG. 28 is an explanatory drawing showing the flow of each step at the time of the non defective unit screening step of step P12, and FIG. 29 is an explanatory drawing showing the motion of each instrument and member in the principal part of screening consistent handler SIH at the time of the non defective unit screening step.

Figure 30:
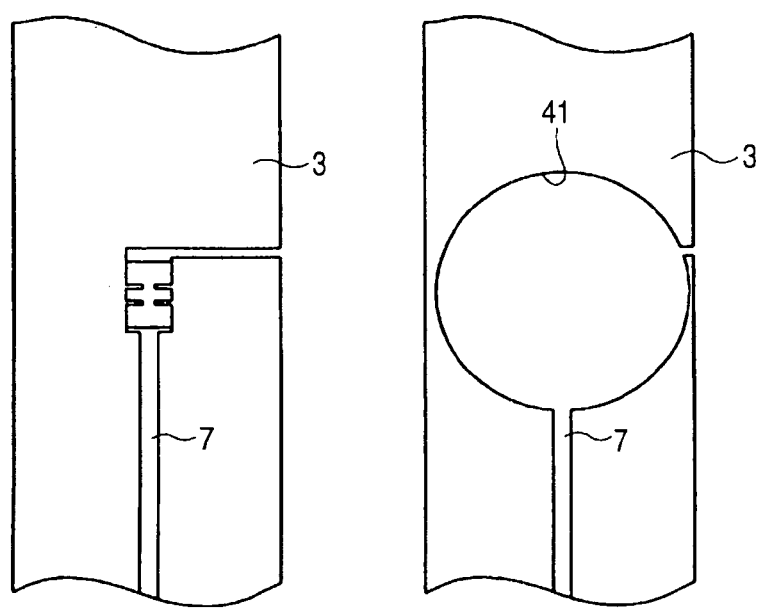
FIG. 30 is a plan view expanding and showing the principal part of the insulating film in the manufacturing process of the inlet for electronic tags which is an electronic device of Embodiment 2 of the present invention.

The first thing of the structural bodies which are formed on insulating film 2 and constitute inlet 1 (refer to FIG. 1-FIG. 7) later is first moved to the location where a non defective unit screening is performed (it is hereafter described as the first screening implementation location) at the time of the non defective unit screening step, and the non defective unit screening is carried out. CCD camera CAM3 is arranged on the first screening implementation location, the plane image of the structural body in the first screening implementation location is photoed, and image data is transmitted to image sensor controller PSC. Image sensor controller PSC analyzes the image data transmitted from CCD cameraCAM3, and distinguishes whether the structural body which is a controlled object (object of a non defective unit screening) is a non defective unit. Namely, since chip 5 is punched with antenna 3 in step P9 (refer to FIG. 13) and, for example opening 41 (refer to FIG. 30) whose diameter is about 2 mm is formed in the structural body when it is a defective unit, image sensor controller PSC judges whether it is a non defective unit by distinguishing the existence of this opening 41 in the analyses of image data. The judged result is transmitted to programmable-controller PLC, and programmable-controller PLC counts each quantity of a non defective unit and a defective unit.

In Embodiment 2, CCD camera CAM3 also plays the same role as CCD camera CAM1 in the Embodiment 1. Namely, the data of the image photoed at the time of the above-mentioned non defective unit screening step are not only used for the non defective unit screening of the above-mentioned structural body, but by being analyzed by image sensor controller PSC, distance L1 (refer to FIG. 26) between coordinates LCT1 (refer to FIG. 26) at which the reference position of the structural body which is a controlled object (object of a non defective unit screening) has stopped and coordinates LCT2 (refer to FIG. 26) at which the reference position must stop essentially is measured. Operation of image sensor controller PSC, operation of programmable-controller PLC, operation of positioning unit LDU, operation of pulse motor unit PMU, and operation of drive roller KRL1 except for that are the same as those of the Embodiment 1. The structural body of the following non defective unit screening processing object can be transported to the first screening implementation location, canceling the effect of a location drift of the structural body of the object of the previous non defective unit screening process in the first screening implementation location, when drive roller KRL1 transports insulating film 2 under such structure. Thereby, the trouble of the structural body which adjoins the structural body of the object of a non defective unit screening process advancing into the first screening implementation location, CCD camera CAM3 photoing the adjoining structural body, and taking out the mistaken screening result can be prevented. Since reflection and rectification are done at the time of the transportation of the following structural body to the first screening implementation location, measuring the location drift at the first screening implementation location for every structural body of the object of a non defective unit screening process, the trouble that the location drift at the first screening implementation location will become large as it becomes a later structural body, when the location drift by the first screening implementation location accumulates can be prevented.

The non defective unit or defective unit of the above-mentioned structural body may be distinguished by using laser sensor LSS further and detecting reflection of the laser beam emitted from the laser sensor LSS before or after the non defective unit screening process using the above-mentioned CCD camera CAM3. In this case, pitch movement magnitude (reference position command value) L2 (refer to FIG. 26) is arranged so that all the above-mentioned structural bodies formed on insulating film 2 may be arranged in equal pitch. Laser sensor LSS is arranged so that a laser beam may shine upon a structural body in the second screening implementation location that spaced out by the integral multiple (n times) of pitch movement magnitude L2 from the first above-mentioned screening implementation location in the extending direction of insulating film 2. Laser sensor LSS transmits the discriminated result of a non defective unit or a defective unit to programmable-controller PLC via sensor amplifier SA1, and programmable-controller PLC counts each quantity of a non defective unit and a defective unit. Thereby, the location drift of a structural body at the second screening implementation location where a laser beam shines upon a structural body is suppressed, and opening 41 formed in the structural body can be distinguished, without doing erroneous recognition. That is, it becomes possible to count still more correctly each number of structural bodies of a non defective unit and a defective unit.

According to the above Embodiment 2, the same effect as the Embodiment 1 can be acquired.

Embodiment 3

In Embodiment 3, insulating film 2 is cut and individually separated to each inlet 1. The transportation method of insulating film 2 applied at step P9 (refer to FIG. 13, FIG. 24, and FIG. 25) in the Embodiment 1 is applied in the cutting step of the insulating film 2.

Figure 31:
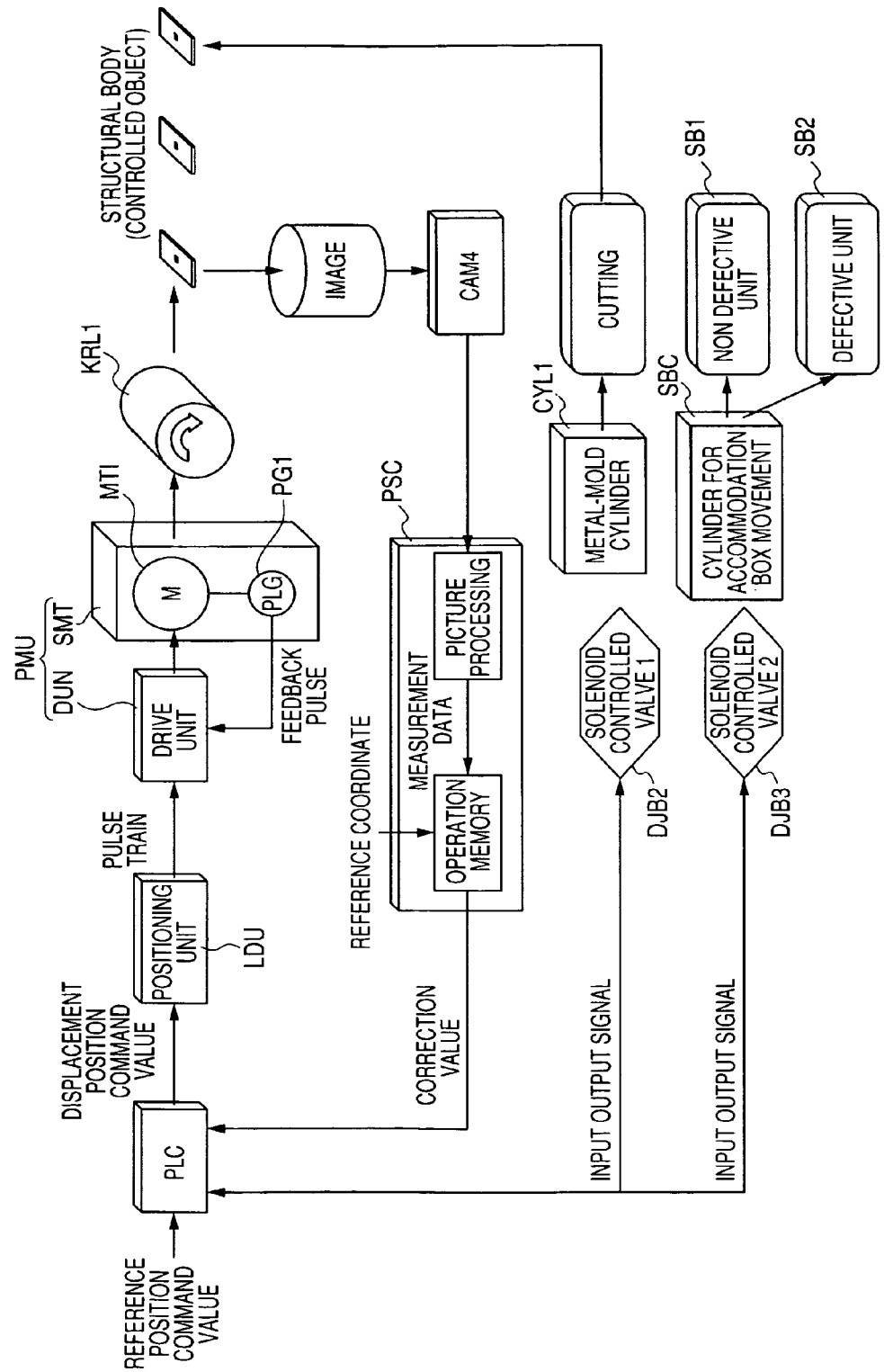
FIG. 31 is an explanatory drawing showing the flow of each step in the individual separation step of an inlet in the manufacturing process of the inlet for electronic tags which is an electronic device of Embodiment 3 of the present invention.
Figure 32:
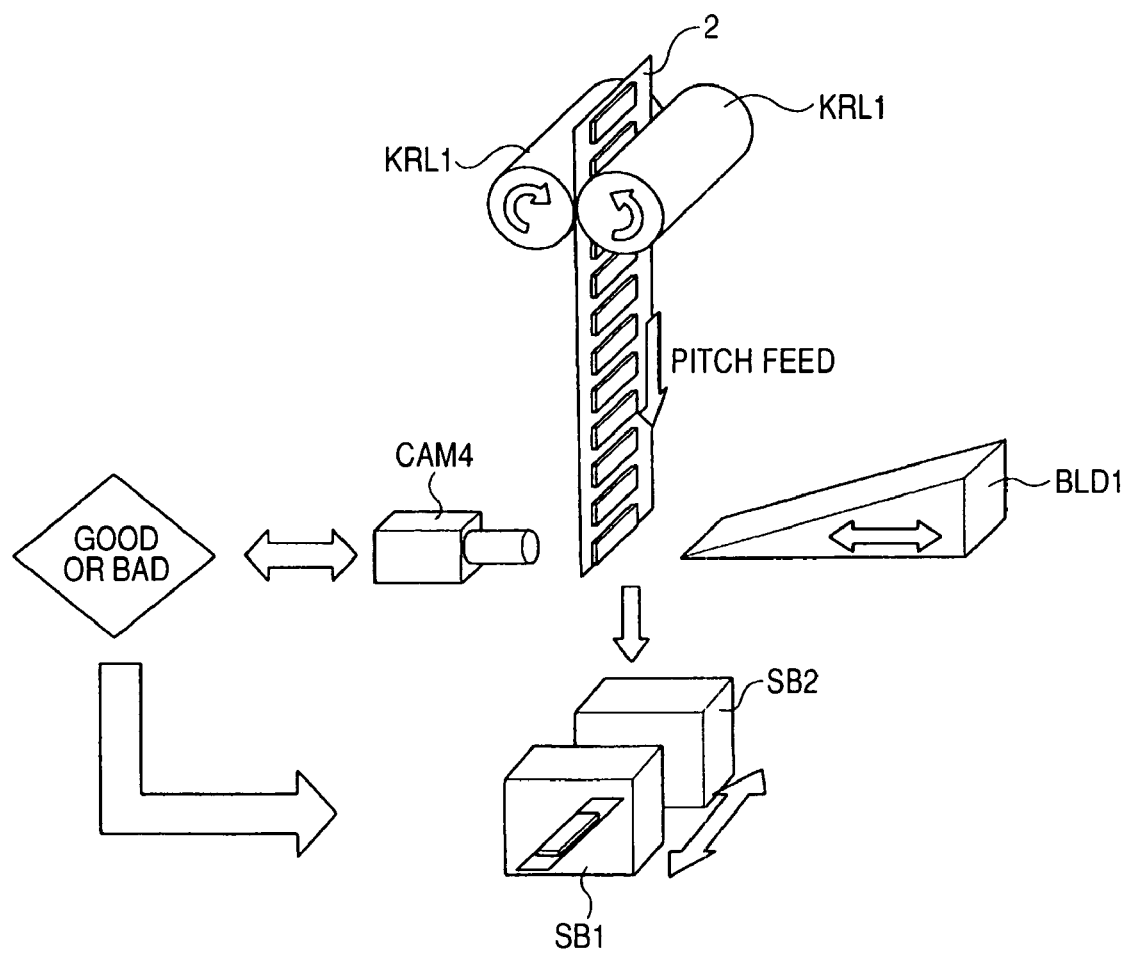
FIG. 32 is an explanatory drawing showing a motion of each instrument and member in the principal part at the time of the individual separation step of an inlet in the manufacturing process of the inlet for electronic tags which is an electronic device of Embodiment 3 of the present invention.
Figure 33:
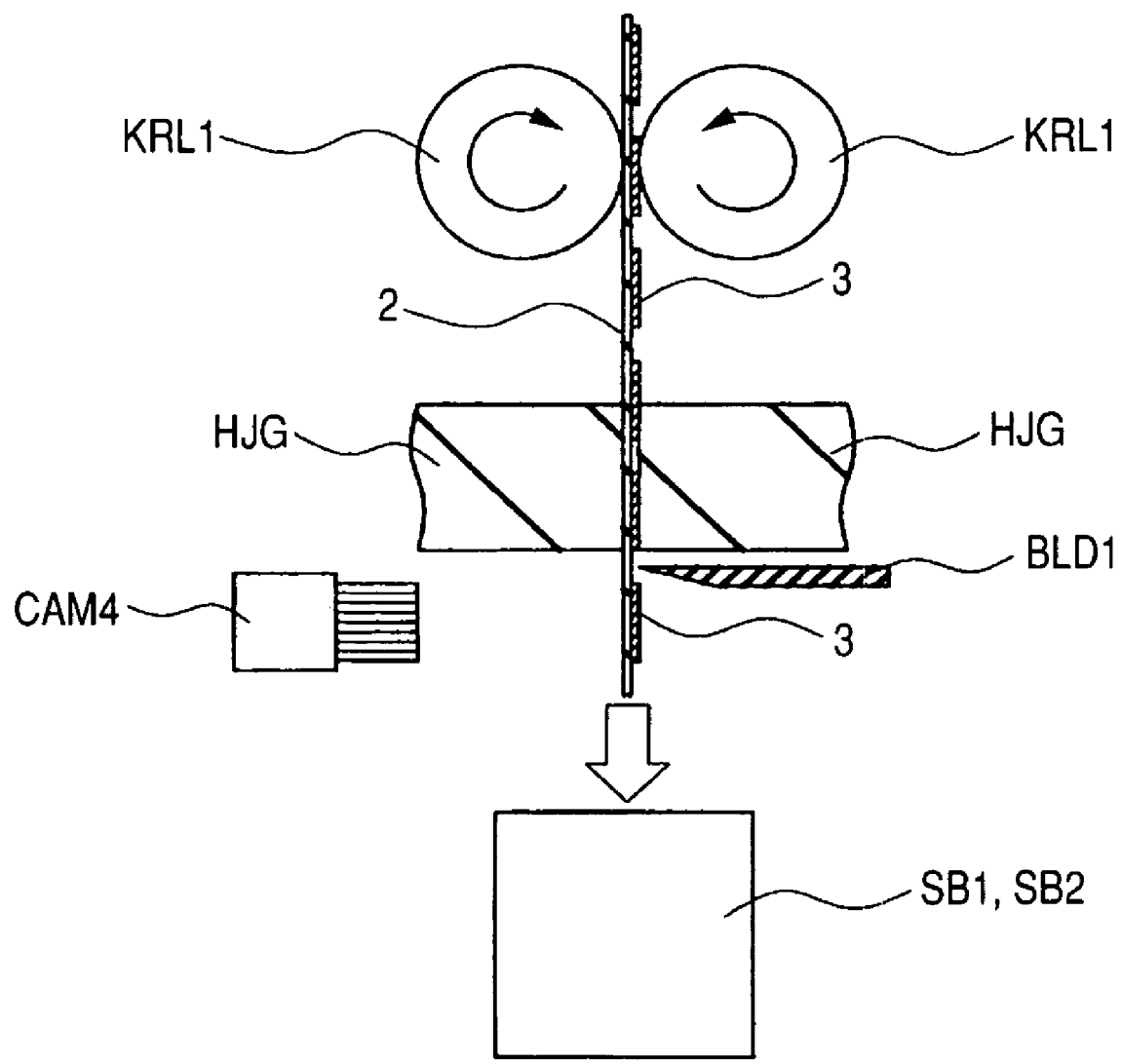
FIG. 33 is a principal part cross-sectional view showing a motion of each instrument and member in the principal part at the time of the individual separation step of an inlet in the manufacturing process of the inlet for electronic tags which is an electronic device of Embodiment 3 of the present invention.

FIG. 31 is an explanatory drawing showing the flow of each step at the time of the cutting step of the insulating film 2. FIG. 32 and FIG. 33 are an explanatory drawing and a principal part cross-sectional view showing the motion of each instrument and member at the time of the cutting step of the insulating film 2, respectively.

The first thing of the structural bodies which are formed on insulating film 2 and constitute inlet 1 (refer to FIG. 1-FIG. 7) later is first moved to the location where cutting processing is performed (it is hereafter described as a cutting processing implementation location) at the time of the cutting step of insulating film 2. At this time, the structural body used as a cutting object is held so that it may extend and exist in the perpendicular direction mostly. In a cut position, CCD camera CAM4 is arranged so that the structural body used as a cutting object may be photoed mostly horizontally, it photos the plane (side face) image of the structural body in a cutting processing implementation location, and transmits image data to image sensor controller PSC. Image sensor controller PSC analyzes the image data transmitted from CCD camera-CAM4, and distinguishes whether the structural body which is a controlled object (object of an individual separation process) is a non defective unit. Namely, since opening 41 (refer to FIG. 30) is formed where chip 5 is punched with antenna 3 in step P9 (refer to FIG. 13) when it is a defective unit, image sensor controller PSC judges whether it is a non defective unit by distinguishing the existence of this opening 41 in the analyses of image data. The judged result is transmitted to programmable-controller PLC. When judged that the structural body is a non defective unit, programmable-controller PLC turns off the output signal of solenoid-controlled-valve DJB2, and closes solenoid-controlled-valve DJB2. Thereby air pressure falls, and cylinder SBC for accommodation box movement which is an air driver operates so that accommodation box SB1 for non defective unit accommodation (first holding means) may be moved to under the structural body of a cutting object (fourth location). On the other hand, when judged that the structural body is a defective unit, programmable-controller PLC transmits an output signal to solenoid-controlled-valve DJB2, and opens solenoid-controlled-valve DJB2. Thereby air pressure rises, and cylinder SBC for accommodation box movement operates so that accommodation box SB2 for defective-unit accommodation may be moved to under the structural body of a cutting object. Under the structural body of a cutting object, the sensor which detects that accommodation box SB1 or accommodation box SB2 moved to under the structural body of a cutting object is formed. This sensor will transmit the signal which tells it, when it detects that accommodation box SB1 or accommodation box SB2 moved to under the structural body of a cutting object. Programmable-controller PLC will transmit the signal which operates holder HJG, when the signal is received. Holder HJG holds and fixes insulating film 2, pinching it from the back and the front. Subsequently, programmable-controller PLC transmits an output signal to solenoid-controlled-valve DJB3, and opens solenoid-controlled-valve DJB3. Thereby air pressure rises, cylinder CYL1 for cutting blade actuation which is an air driver operates cutting blade BLD1, cutting blade BLD1 cuts insulating film 2 between antennas 3, and inlet 1 individually separated is obtained. Since accommodation box SB1 or accommodation box SB2 is arranged under the structural body of a cutting object, inlet 1 individually separated can be accommodated in accommodation box SB1, when it is a non defective unit, and when it is a defective unit, it can be accommodated in accommodation box SB2, respectively.

In Embodiment 3, CCD camera CAM4 also plays the same role as CCD camera CAM1 in the Embodiment 1. Namely, the data of the image photoed at the time of the individual separation step of the above-mentioned inlet 1 are not only used for the non defective unit screening of the above-mentioned structural body, but by being analyzed by image sensor controller PSC, distance L1 (refer to FIG. 26) between coordinates LCT1 (refer to FIG. 26) at which the reference position of the structural body which is a controlled object (object of a cutting (individual separation) process) has stopped, and coordinates LCT2 (refer to FIG. 26) at which the reference position must stop essentially is measured. Operation of image sensor controller PSC, operation of programmable-controller PLC, operation of positioning unit LDU, operation of pulse motor unit PMU, and operation of drive roller KRL1 except for that are the same as those of the Embodiment 1. The structural body of the object of the next cutting processing can be transported to a cut position, canceling the effect of the location drift of the structural body of the object of previous cutting processing in the above-mentioned cut position, when drive roller KRL1 transports insulating film 2 under such structure. Thereby, the trouble of the structural body which adjoins the structural body of the object of cutting processing advancing into a cut position, CCD camera CAM4 photoing the adjoining structural body, and taking out the mistaken screening result can be prevented. Since reflection and rectification are done at the time of the transportation to the cut position of the following structural body, measuring the location drift by a cut position for every structural body of the object of cutting processing, the trouble that the location drift at a cut position will become large as it becomes a later structural body, when the location drift at a cut position accumulates can be prevented.

According to the above Embodiment 3, the same effect as the Embodiments 1 and 2 can be acquired.

Embodiment 4

In Embodiment 4, the transportation method of insulating film 2 applied in the Embodiment 1 at step P9 (refer to FIG. 13, FIG. 24, and FIG. 25) is applied to the sprocket hole work process of step P8 (refer to FIG. 13).

As mentioned above also in the Embodiment 1, when the request from a customer is received, sprocket holes (first hole) 36 (refer to FIG. 23) are formed with sprocket hole opening machine SHK (refer to FIG. 12) in Embodiment 4. Sprocket holes 36 are formed in order to transport insulating film 2 using a sprocket, when for example, performing the cutting (individual separation) process of inlet 1 (refer to FIG. 1-FIG. 7) at the customer side.

Figure 34:
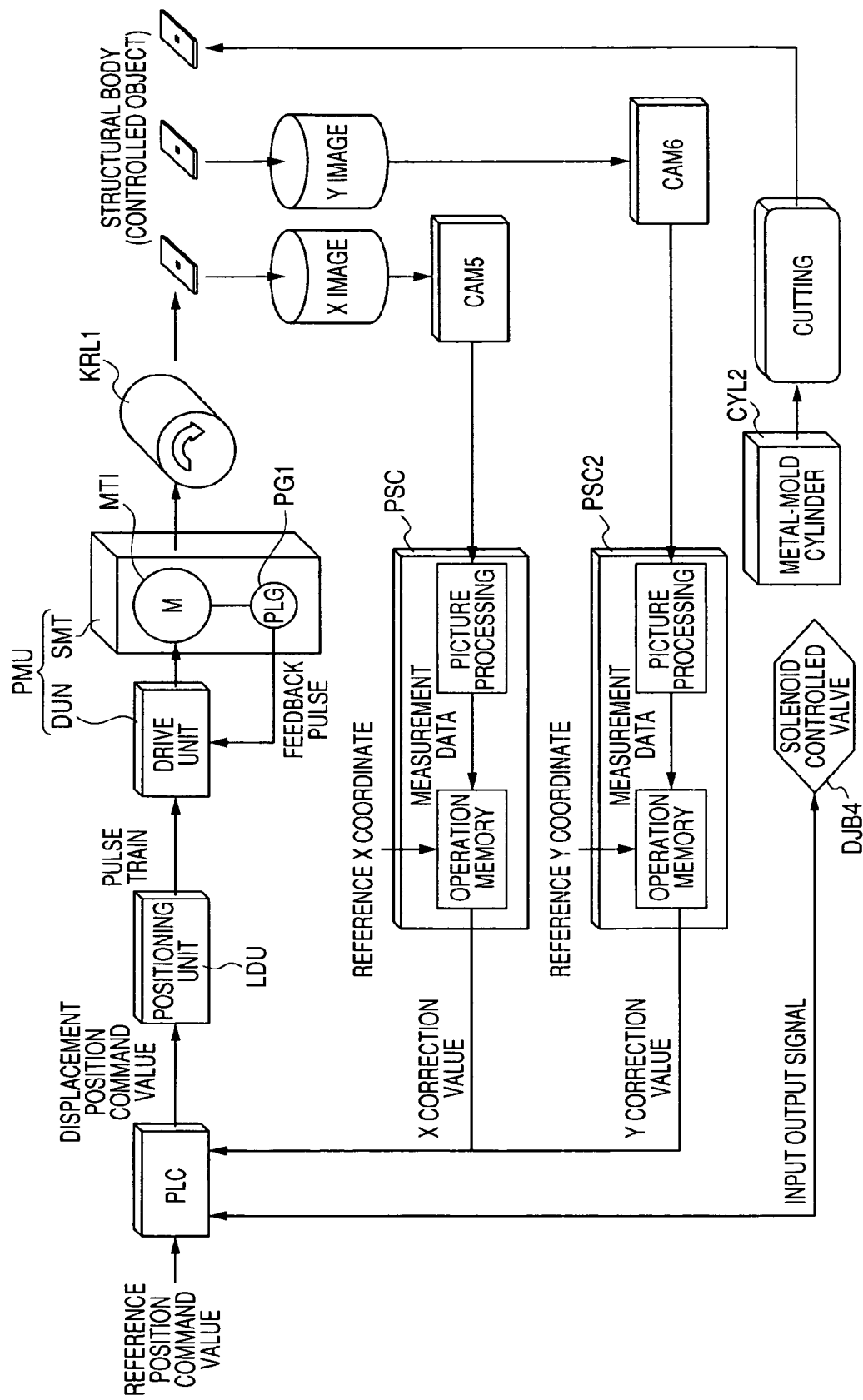
FIG. 34 is an explanatory drawing showing the flow of each step in the sprocket hole work process in the manufacturing process of the inlet for electronic tags which is an electronic device of Embodiment 4 of the present invention.
Figure 35:
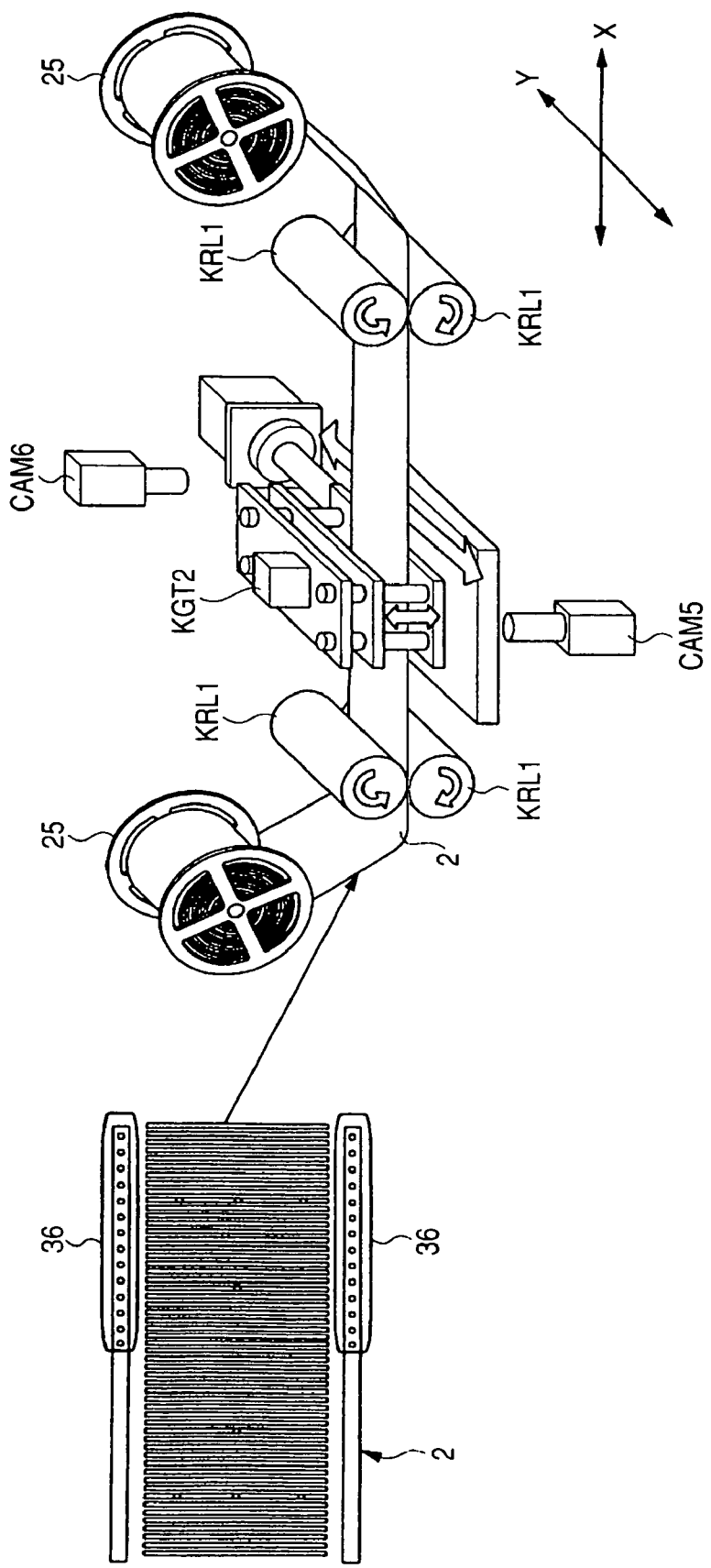
FIG. 35 is an explanatory drawing showing a motion of each instrument and member in the principal part at the time of the sprocket hole work process in the manufacturing process of the inlet for electronic tags which is an electronic device of Embodiment 4 of the present invention.

FIG. 34 is an explanatory drawing showing the flow of each step at the time of the sprocket hole work process of step P8, and FIG. 35 is an explanatory drawing showing a motion of each instrument and member in the principal part of sprocket hole opening machine SHK at the time of the sprocket hole work process.

In the time of the sprocket hole work process, first, the first thing of the structural bodies which are formed on insulating film 2 and constitute inlet 1 later is moved to the location where processing of sprocket hole 36 is performed (it is hereafter described as a processing position), and sprocket hole 36 is formed in insulating film 2. CCD camera CAM5 is arranged on a processing position or under a processing position, the plane image of the structural body in a processing position is photoed, and image data is transmitted to image sensor controller PSC.

CCD camera CAM5 also plays the same role as CCD camera CAM1 in the Embodiment 1. Namely, as for the image photoed by CCD camera CAM5, when analyzed by image sensor controller PSC, distance L1 (refer to FIG. 26) between coordinates LCT1 (refer to FIG. 26) at which the reference position of the structural body which is a controlled object (object of sprocket hole processing) has stopped, and coordinates LCT2 (refer to FIG. 26) at which the reference position must stop essentially is measured. Operation of image sensor controller PSC, operation of programmable-controller PLC, operation of positioning unit LDU, operation of pulse motor unit PMU, and operation of drive roller KRL1 except for that are the same as those of the Embodiment 1. The following structural body can be transported to the processing position, canceling the effect of a location drift of the previous structural body at the processing position, when drive roller KRL1 transports insulating film 2 under such structure.

By the way, at the time of transportation of insulating film 2 by a roller carrier system, the characteristics that insulating film 2 under transportation moves in a zigzag direction exist, and there is a possibility that a meandering amount and the meandering direction may also change. Sprocket hole 36 always needs to be opened at the fixed location in the transportation direction (the following Embodiment 4 describes it as the X direction) of insulating film 2, and the direction which intersects perpendicularly with the X direction (the following Embodiment 4 describes it as the Y direction). That is, it is because insulating film 2 is transported hooking sprocket hole 36 on the projection formed in the periphery of the sprocket with the constant interval at the time of sprocket transportation. When the opening position in the both sides of the X direction and the Y direction of sprocket hole 36 is not exact, there is a possibility that the troubles that insulating film 2 is damaged by contact of a projection and insulating film 2, or insulating film 2 derails in the middle of transportation may occur.

So, in Embodiment 4, CCD camera CAM6 for measuring the location drift (meandering amount) by the Y direction of insulating film 2 is further arranged on insulating film 2. CCD camera CAM6 photos the plane image (second image) of the above-mentioned structural body under CCD camera CAM6, and it transmits image data to image sensor controller PSC2. Image sensor controller PSC2 measures the amount (the third amount of drifts) L4 of location drifts in the Y direction of the above-mentioned structural body under CCD camera CAM6 with the same method as the measuring method of the amount of location drifts in the X direction of a structural body (the second amount of drifts) by image sensor controller PSC. This amount L4 of location drifts is transmitted to programmable-controller PLC as a correction value in the Y direction. Programmable-controller PLC which received the information about the amount L4 of location drifts transmits a signal to metal-mold (opening means) KGT2 which opens sprocket hole 36 so that it may move only the amount L4 of location drifts to the Y direction, and it moves metal-mold KGT2 only the amount L4 of location drifts to the Y direction. Subsequently, programmable-controller PLC transmits an output signal to solenoid-controlled-valve DJB4, and opens solenoid-controlled-valve DJB4. Thereby air pressure rises, cylinder CYL2 for metal-mold KGT2 actuation which is an air driver operates metal-mold KGT2, and sprocket hole 36 is formed in insulating film 2.

By forming sprocket hole 36 under the above structure, sprocket hole 36 can make an opening to insulating film 2 in a location exact on the both sides of the X direction and the Y direction, canceling the effect of the location drift (meandering) by the both sides of the X direction and the Y direction of insulating film 2 which precede in a transportation direction. Since reflection and rectification are done at the time of formation of the following sprocket hole 36, measuring the location drift by the both sides of the X direction and the Y direction of insulating film 2 whenever it performs opening of sprocket hole 36 once, the trouble that a location drift of an opening position will become large as it becomes later sprocket hole 36, when a location drift of the opening position of sprocket hole 36 accumulates can be prevented.

According to the above Embodiment 4, the same effect as Embodiments 1-3 can be acquired.

Embodiment 5

In Embodiment 5, the transportation method of insulating film 2 applied in the Embodiment 1 at step P9 (refer to FIG. 13, FIG. 24, and FIG. 25) is applied at the visual-inspection step of step P13 (refer to FIG. 13).

Figure 36:
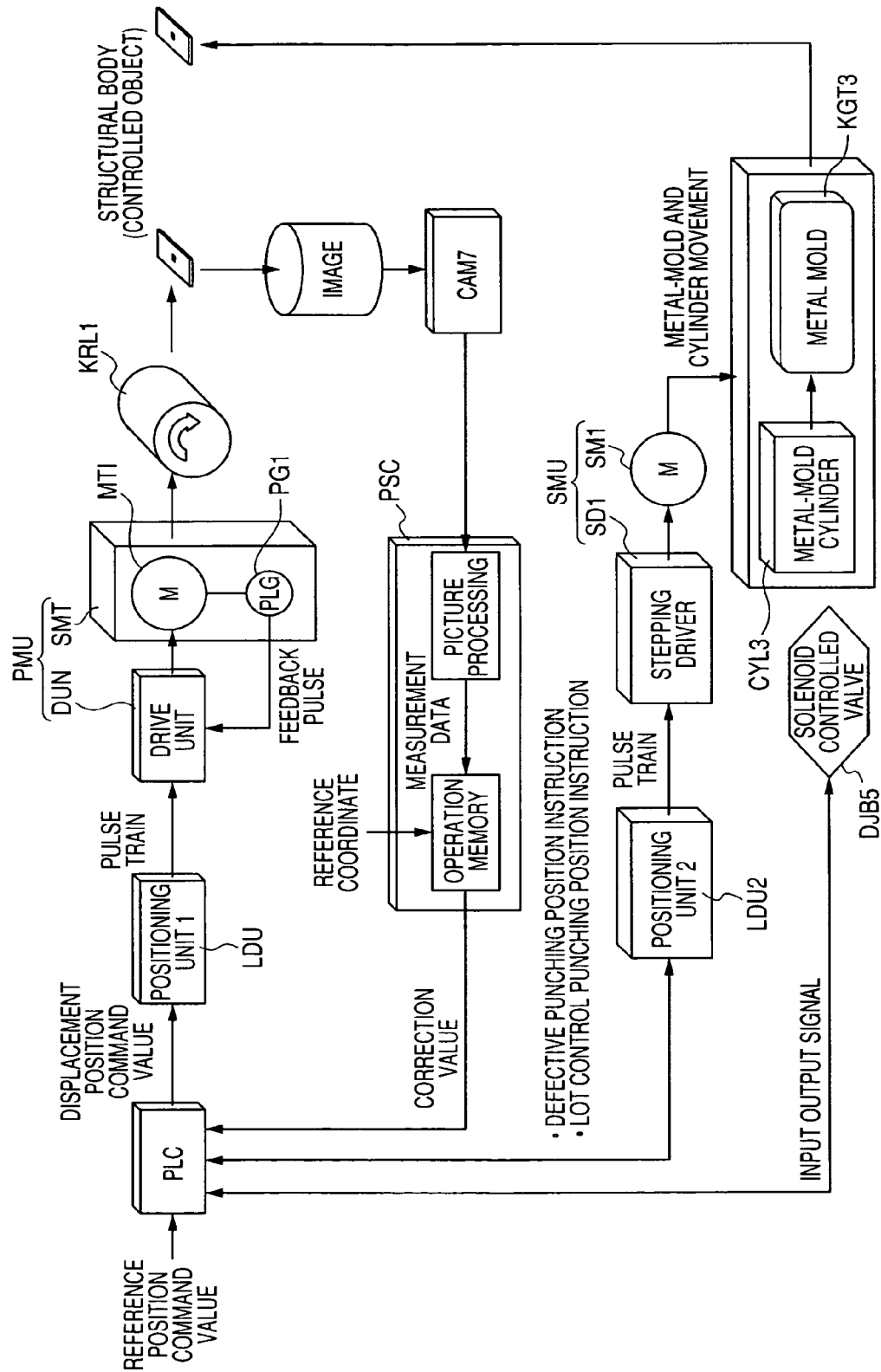
FIG. 36 is an explanatory drawing showing the flow of each step in the visual-inspection step in the manufacturing process of the inlet for electronic tags which is an electronic device of Embodiment 5 of the present invention.
Figure 37:
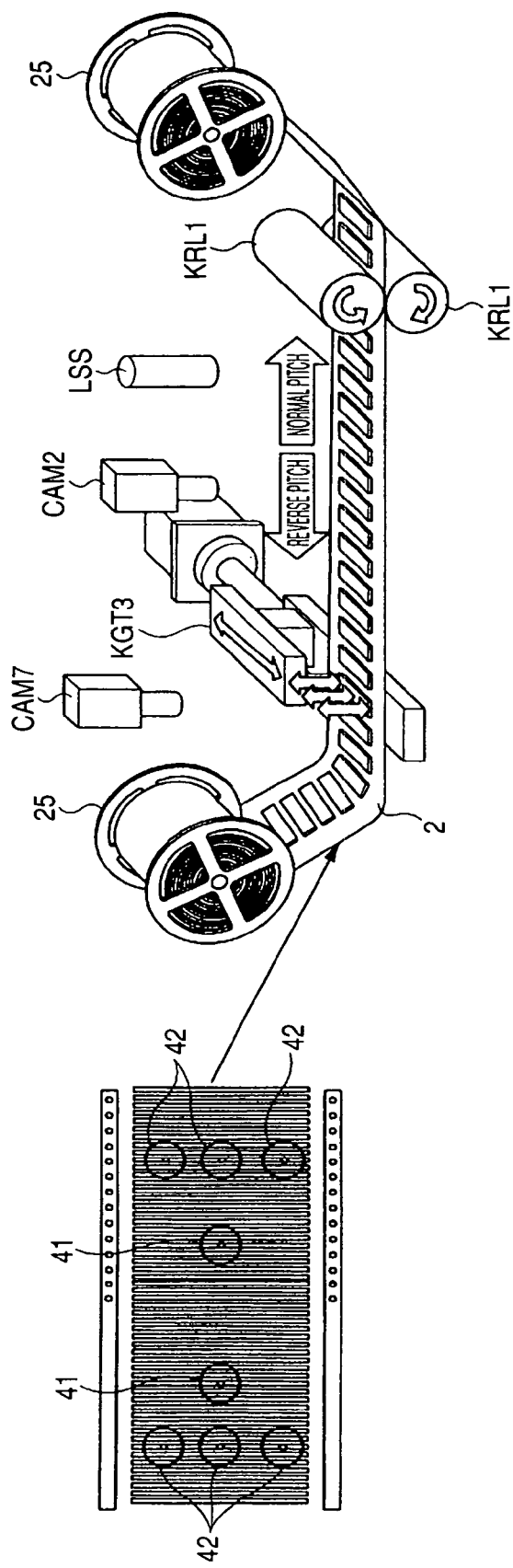
FIG. 37 is an explanatory drawing showing a motion of each instrument and member in the principal part at the time of the visual-inspection step in the manufacturing process of the inlet for electronic tags which is an electronic device of Embodiment 5 of the present invention.

FIG. 36 is an explanatory drawing showing the flow of each step of the time of the visual-inspection step of step P13, and FIG. 37 is an explanatory drawing showing a motion of each instrument and member in the principal part of semiautomatic visual inspection apparatus HGK2 at the time of the visual-inspection step.

In Embodiment 5, insulating film 2 is transported by a block feed method at the time of the visual-inspection step. Here, a block feed method is a method which moves the structural body which is formed on insulating film 2 and constitutes inlet 1 later by every predetermined number (for example, about 40 pieces-50 pieces) to the location where a visual inspection is conducted (fifth location (it is hereafter described as a visual-inspection location)). The means which was explained by the Embodiment 1 to transport insulating film 2 rectifying a location drift of a structural body can also be used together.

After moving a structural body group to be examined to a visual-inspection location, the visual inspection of the structural body included in the structural body group is conducted. In this visual inspection, as the Embodiment 1 also explained, the detection of an external appearance failure by picture processing of semiautomatic visual inspection apparatus HGK2, the detection of an external appearance failure by an operator viewing the image in which extended projection is done to a checking monitor display, or those both can be chosen suitably.

Next, the structural body from which the external appearance failure was detected by the visual inspection is moved to a specified position, and chip 5 is removed from the structural body, punched by metal-mold KGT3 with antenna 3. On this occasion, the transportation method of insulating film 2 explained by the Embodiment 1 is applicable. That is, one of the structural bodies from which the external appearance failure was detected by the visual inspection is moved to the location (it is hereafter described as a punching position) where punching by metal-mold KGT3 is performed, and chip 5 is punched with antenna 3 by metal-mold KGT3. When the target structural body is located back than metal-mold KGT3 in the transportation direction of insulating film 2 at this time, insulating film 2 is transported in the direction contrary to the transportation direction. This reverse direction transportation is carried out by doing counterrotation of the motor MT1 included in servo-motor SMT of pulse motor unit PMU. CCD camera CAM7 is arranged on a punching position or under a punching position, the plane image of the structural body in a punching position is photoed, and image data is transmitted to image sensor controller PSC. As for the image photoed by CCD camera CAM7, when analyzed by image sensor controller PSC, distance L1 (refer to FIG. 26) between coordinates LCT1 (refer to FIG. 26) at which the reference position of the structural body which is a controlled object (object of a punching process of chip 5) has stopped, and coordinates LCT2 (refer to FIG. 26) at which the reference position must stop essentially is measured. Operation of image sensor controller PSC, operation of programmable-controller PLC, operation of positioning unit LDU2, operation of pulse motor unit PMU, and operation of drive roller KRL1 except for that are the same as those of the Embodiment 1. The following structural body can be transported to a punching position, canceling the effect of the location drift of a previous structural body in a punching position, when drive roller KRL1 transports insulating film 2 under such structure.

When the structural body of a controlled object is moved to a punching position, programmable-controller PLC will transmit a signal to positioning unit LDU2 so that metal-mold KGT3 may be moved to a punching position. This positioning unit LDU2 is a pulse generator which sends the pulse wave which drives stepping motor unit SMU used as the driving source for moving metal-mold KGT3 to a punching position. Stepping motor unit SMU includes stepping driver SD1 and stepping motor SM1. Stepping motor SM1 is a kind of a pulse motor. The pulse wave sent from positioning unit LDU2 is received by stepping driver SD1 which controls operation of stepping motor SM1. Stepping driver SD1 operates stepping motor SM1 only the amount corresponding to the pulse wave which received, and moves metal-mold KGT3 to a punching position. Subsequently, programmable-controller PLC transmits an output signal to solenoid-controlled-valve DJB5, and opens solenoid-controlled-valve DJB5. Thereby air pressure rises, and cylinder CYL3 for metal-mold KGT3 actuation which is an air driver operates metal-mold KGT3, and chip 5 is punched. Hereby, opening 41 (also see the FIG. 30) is formed in a structural body.

Chip 5 can be punched in an exact location, canceling the effect of a location drift of the structural body of a previous controlled object (object of a punching process of chip 5) by punching chip 5 under the above structure from the structural body from which the external appearance failure was detected. Since reflection and rectification are done at the time of punching of the following chip 5, measuring a location drift of the structural body of a controlled object whenever it performs punching of chip 5 once, the trouble that a location drift of an opening position will become large as it becomes opening 41 having an opening later when a location drift of the opening position of opening 41 accumulates can be prevented.

On insulating film 2, the above-mentioned structural body of a plurality of lots (product group) may be formed. In such a case, a plurality of openings of the lot control hole (first mark) 42 for grasping a lot are done to the structural bodies used as the head and the tail of one lot. In order to make this lot control hole 42, the above-mentioned metal-mold KGT3 may be used. At this time, metal-mold KGT3 makes lot control hole 42 one by one. A pulse wave is sent from positioning unit LDU2 so that metal-mold KGT3 may be arranged to the opening position (fifth location). About movement of the structural body which is the object of opening of lot control hole 42, since control of being the same as that of movement of the structural body which is the object of the above-mentioned punching process of chip 5 is made, a location drift can be suppressed. One of lot control holes 42 is made at the same location as the above-mentioned opening 41.

The structure of making the above-mentioned lot control hole 42 by the command from an operator may also be good. For example, semiautomatic visual inspection apparatus HGK2 is changed into the state for openings of lot control hole 42 by an operator turning ON the switch formed in semiautomatic visual inspection apparatus HGK2. When programmable-controller PLC detects that the switch was set to ON at this time, programmable-controller PLC will transmit a signal so that metal-mold KGT3 may be moved to the opening position of metal-mold KGT3 to positioning unit LDU2. Henceforth, operation of each instrument until lot control hole 42 is made is as having mentioned above.

It is also good to be the structure which also uses programmable-controller PLC and counts the number of non defective units and the number of defective units of the above-mentioned structural body, arranging CCD cameraCAM2 (refer to FIG. 25) explained by the Embodiment 1, laser sensor LSS explained by the Embodiment 2, or those both in the location (third location) after formation of opening 41 and lot control hole 42. When there is an operation which moves insulating film 2 which was described above in the direction contrary to a transportation direction here, the process which subtracts each number of structural bodies of the non defective unit and the defective unit which are passed in the meantime (third number, fourth number) by programmable-controller PLC, respectively from the number of non defective units and the number of defective units which were counted by then is performed.

According to the above Embodiment 5, the same effect as Embodiments 1-4 can be acquired.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

Although the antenna was formed using the Al foil stuck on the insulating film which includes polyethylene terephthalate in the above-mentioned embodiments, the antenna may be formed using Cu foil stuck on one side of an insulating film, for example, or the insulating film may include polyimide resin.

The manufacturing method of the electronic device of the present invention is applicable in the manufacturing process of the inlet for electronic tags, for example.

What is claimed is:

1. A manufacturing method of electronic tags each having an antenna which includes a conductive film formed in a main surface of an insulating film, a slit which is formed in a part of the antenna, and whose end extends and exists to an outer edge of the antenna, a semiconductor chip electrically connected to the antenna via a plurality of bump electrodes, and resin which seals the semiconductor chip, comprising the steps of:

(a) preparing an insulating tape of continuation form having a plurality of structural bodies each of which corresponds to the electronic tag, each of the structural bodies being arranged in one direction at a predetermined pitch;

(b) moving a first structural body of the structural bodies to a first position along the one direction, so as to perform an electrical communication test to the first structural body, by transporting by frictional force pinching both sides of the insulating tape with two rollers, the first position being inherently out of alignment from a predetermined correct position for the electrical communication test;

(c) performing the electrical communication test to the first structural body under a situation where the first structural body is moved to the first position;

(d) measuring a first amount of drifts between the first position and the predetermined correct position by an image of the first structural body under a situation where the first structural body is moved to the first position;

(e) moving a second structural body among the structural bodies arranged in the predetermined pitch with the first structural body toward the first position such that a total moving distance of the second structural body is substantially equal to a distance of a sum of the predetermined pitch and the first amount of drifts, by transporting by frictional force pinching both sides of the insulating tape with the two rollers, and (f) after the step (e), dividing the insulating tape into individual structural bodies each corresponding to one of the electronic tags having the antenna of the conductive film and the semiconductor chip sealed with the resin.

2. The manufacturing method of an electronic device according to claim 1, wherein
repeating the step (c) and the step (d) for the second structural body after the step (d), the step (c) and the step (d) are carried out on the first structural body.

3. The manufacturing method of an electronic device according to claim 2, wherein
each of the structural bodies is continuously arranged in the first pitch with the structural body which adjoins; and
the electrical communication test is an electric-wave characteristic test of the first structural body;
wherein, when a defect is detected by the electric-wave characteristic test, the semiconductor chip is removed from the first structural body; and
wherein, in a third position which is spaced out by an integral multiple of the first pitch from the first position in a transportation direction of the insulating film, existence of the semiconductor chip in the first structural body is detected by a first optical detecting means, and a first number of the first structural body including the semiconductor chip and a second number of the first structural body that does not include the semiconductor chip are investigated, respectively.

4. The manufacturing method of an electronic device according to claim 3, wherein
the first optical detecting means detects existence of the semiconductor chip in the first structural body by picture processing.

5. The manufacturing method of an electronic device according to claim 1, wherein
the first amount of drifts is determined in a direction along a transportation direction of the insulating film.

6. The manufacturing method of an electronic device according to claim 1, wherein
the electrical communication test is an electric-wave characteristic test of the first structural body; and
when a defect is detected by the electric-wave characteristic test, the semiconductor chip is removed from the first structural body.

7. The manufacturing method of an electronic device according to claim 6, wherein
each of the structural bodies is continuously arranged in the first pitch with the structural body which adjoins; and
in a second position which is spaced out by an integral multiple of the first pitch from the first position in a transportation direction of the insulating film, the semiconductor chip is removed from the first structural body from which the defect was detected by the electric-wave characteristic test by a removing means arranged over the second position.

8. The manufacturing method of an electronic device according to claim 1, wherein:
before the electrical communication test, a first test is performed beforehand to the structural bodies; and
in the first electrical communication test, existence of the semiconductor chip in the first structural body is distinguished from the image of the first structural body where it is moved from the first position, and a first number of the first structural body including the semiconductor chip and a second number of the first structural body that does not include the semiconductor chip are investigated, respectively.

* * * * *